US009349452B2

(12) United States Patent
Dunga et al.

(10) Patent No.: US 9,349,452 B2
(45) Date of Patent: May 24, 2016

(54) HYBRID NON-VOLATILE MEMORY CELLS FOR SHARED BIT LINE

(71) Applicant: SANDISK TECHNOLOGIES INC., Plano, TX (US)

(72) Inventors: Mohan V. Dunga, Santa Clara, CA (US); Masaaki Higashitani, Cupertino, CA (US)

(73) Assignee: SanDisk Technologies Inc., Plano, TX (US)

(*) Notice: Subject to any disclaimer, the term of this patent is extended or adjusted under 35 U.S.C. 154(b) by 114 days.

(21) Appl. No.: 13/788,183

(22) Filed: Mar. 7, 2013

(65) Prior Publication Data

US 2014/0254268 A1   Sep. 11, 2014

(51) Int. Cl.
G11C 16/04 (2006.01)
H01L 29/66 (2006.01)
H01L 29/788 (2006.01)
G11C 7/18 (2006.01)
G11C 16/24 (2006.01)
H01L 27/115 (2006.01)

(52) U.S. Cl.
CPC .............. *G11C 16/0425* (2013.01); *G11C 7/18* (2013.01); *G11C 16/0483* (2013.01); *G11C 16/24* (2013.01); *H01L 27/1157* (2013.01); *H01L 27/11524* (2013.01); *H01L 29/66825* (2013.01); *H01L 29/788* (2013.01)

(58) Field of Classification Search
CPC .............................. G11C 16/04; G11C 16/0425
USPC ............................................ 365/185, 10, 17
See application file for complete search history.

(56) References Cited

U.S. PATENT DOCUMENTS

| 5,936,887 | A | * | 8/1999 | Choi et al. ............... 365/185.17 |
| 6,028,788 | A | | 2/2000 | Choi |
| 6,072,713 | A | | 6/2000 | McKenny |
| 6,091,633 | A | | 7/2000 | Cernea |
| 6,151,249 | A | | 11/2000 | Shiorta |
| 6,480,422 | B1 | | 11/2002 | Wong |
| 6,620,683 | B1 | | 9/2003 | Lin |
| 7,034,360 | B2 | | 4/2006 | Kim et al. |
| 7,169,624 | B2 | | 1/2007 | Hsu |
| 7,237,074 | B2 | | 6/2007 | Guterman |
| 7,244,984 | B2 | | 7/2007 | Kamigaichi |

(Continued)

OTHER PUBLICATIONS

"A New Shared Bit Line NAND Cell Technology for the 256 Mb Flash Memory with 12V Programming," Shin et al., IEEE, 1996.

(Continued)

*Primary Examiner* — Hoai V Ho
*Assistant Examiner* — Muna A Techane
(74) *Attorney, Agent, or Firm* — Vierra Magen Marcus LLP

(57) ABSTRACT

A non-volatile storage system includes a plurality of groups of connected non-volatile storage elements. Each group comprises multiple connected data non-volatile storage elements and multiple select gates on a common side of the data non-volatile storage elements. The multiple select gates comprise a first select gate and a second select gate. The first select gate has a first threshold voltage for a first subset of the groups and a second threshold voltage for a second subset of the groups due to active area implantation for the second subset of groups that causes the second threshold voltage to be lower than the first threshold voltage. The second select gate of each group has a programmable threshold voltage. Each of the plurality of bit lines are connected to multiple groups of connected non-volatile storage elements.

13 Claims, 20 Drawing Sheets

(56) References Cited

U.S. PATENT DOCUMENTS

| | | | |
|---|---|---|---|
| 7,259,991 | B2 | 8/2007 | Aritome |
| 7,411,825 | B2 | 8/2008 | Kutsukake et al. |
| 7,508,714 | B2 | 3/2009 | Fasoli |
| 7,616,490 | B2 | 11/2009 | Mokhlesi |
| 8,194,472 | B2 | 6/2012 | Sato |
| 8,335,108 | B2 | 12/2012 | Lee et al. |
| 2006/0003558 | A1* | 1/2006 | Bang .............................. 438/510 |
| 2009/0268524 | A1 | 10/2009 | Maejima |
| 2009/0302472 | A1 | 12/2009 | Yoon |
| 2010/0085812 | A1* | 4/2010 | Kang et al. ................ 365/185.17 |
| 2011/0199833 | A1* | 8/2011 | Shim et al. ................ 365/185.23 |
| 2011/0211392 | A1 | 9/2011 | Kim |
| 2011/0249503 | A1 | 10/2011 | Yamada |
| 2012/0147676 | A1* | 6/2012 | Mokhlesi et al. ......... 365/185.17 |
| 2012/0195125 | A1 | 8/2012 | Choe et al. |
| 2012/0224424 | A1* | 9/2012 | Lee ........................... 365/185.05 |
| 2013/0128669 | A1* | 5/2013 | Mokhlesi et al. ......... 365/185.17 |
| 2013/0248974 | A1 | 9/2013 | Alsmeier et al. |

OTHER PUBLICATIONS

U.S. Appl. No. 13/674,470, filed Nov. 12, 2012.
U.S. Appl. No. 13/793,925, filed Mar. 11, 2013.
PCT International Search Report dated May 16, 2014, PCT Patent Application No. PCT/US2014/018126.
PCT Written Opinion of the International Searching Authority dated May 16, 2014, PCT Patent Application No. PCT/US2014/018126.
PCT Invitation to Pay Additional Fees, PCT Patent Application No. PCT/US2014/018126.
PCT Annex, Communication Relating to the Results of the Partial International Search, PCT Patent Application No. PCT/US2014/018126.
International Preliminary Report on Patentability dated Sep. 8, 2015 in PCT Application No. PCT/US2014/018126 filed Feb. 25, 2014, 10 pages.
Office Action dated Dec. 17, 2014, U.S. Appl. No. 13/793,925.
Klein, "Choosing the Right NAND Flash Memory Technology." Micron. Dec. 2010.
PCT International Search Report dated Sep. 12, 2014, PCT Patent Application No. PCT/US2014/019732.
PCT Written Opinion of the International Searching Authority dated Sep. 12, 2014, PCT Patent Application No. PCT/US2014/019732.
Response to Office Action filed Mar. 31, 2015 in U.S. Appl. No. 13/793,925.
Notice of Allowance and Fee(s) Due dated Oct. 29, 2015 in U.S. Appl. No. 13/793,925.

* cited by examiner

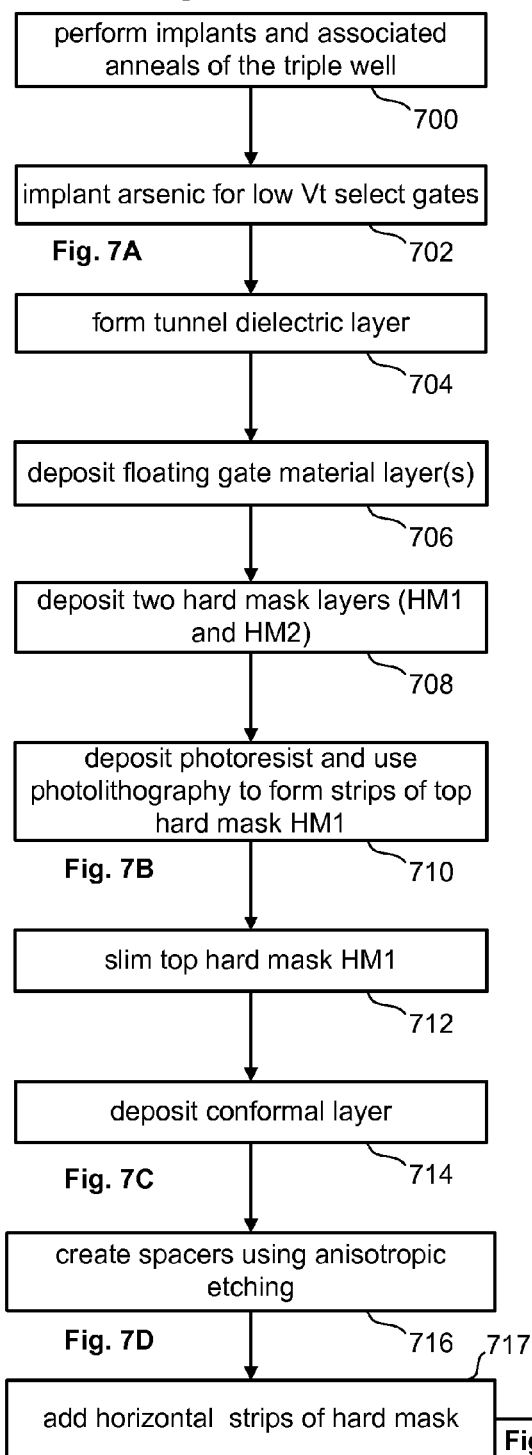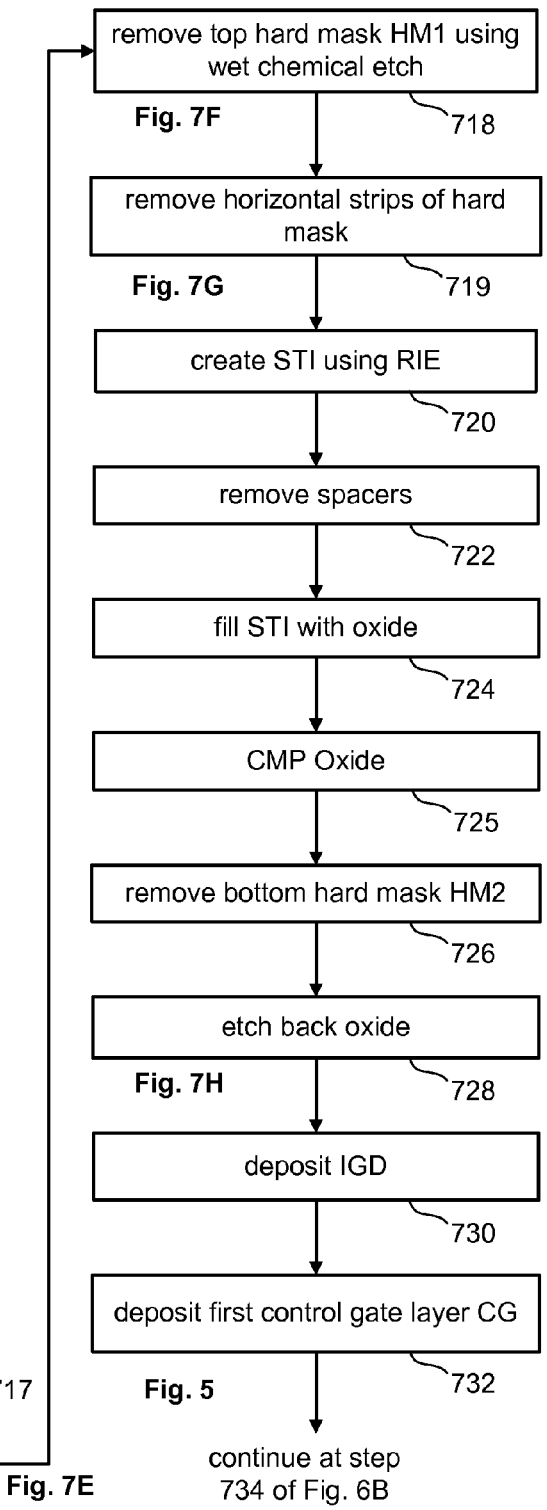

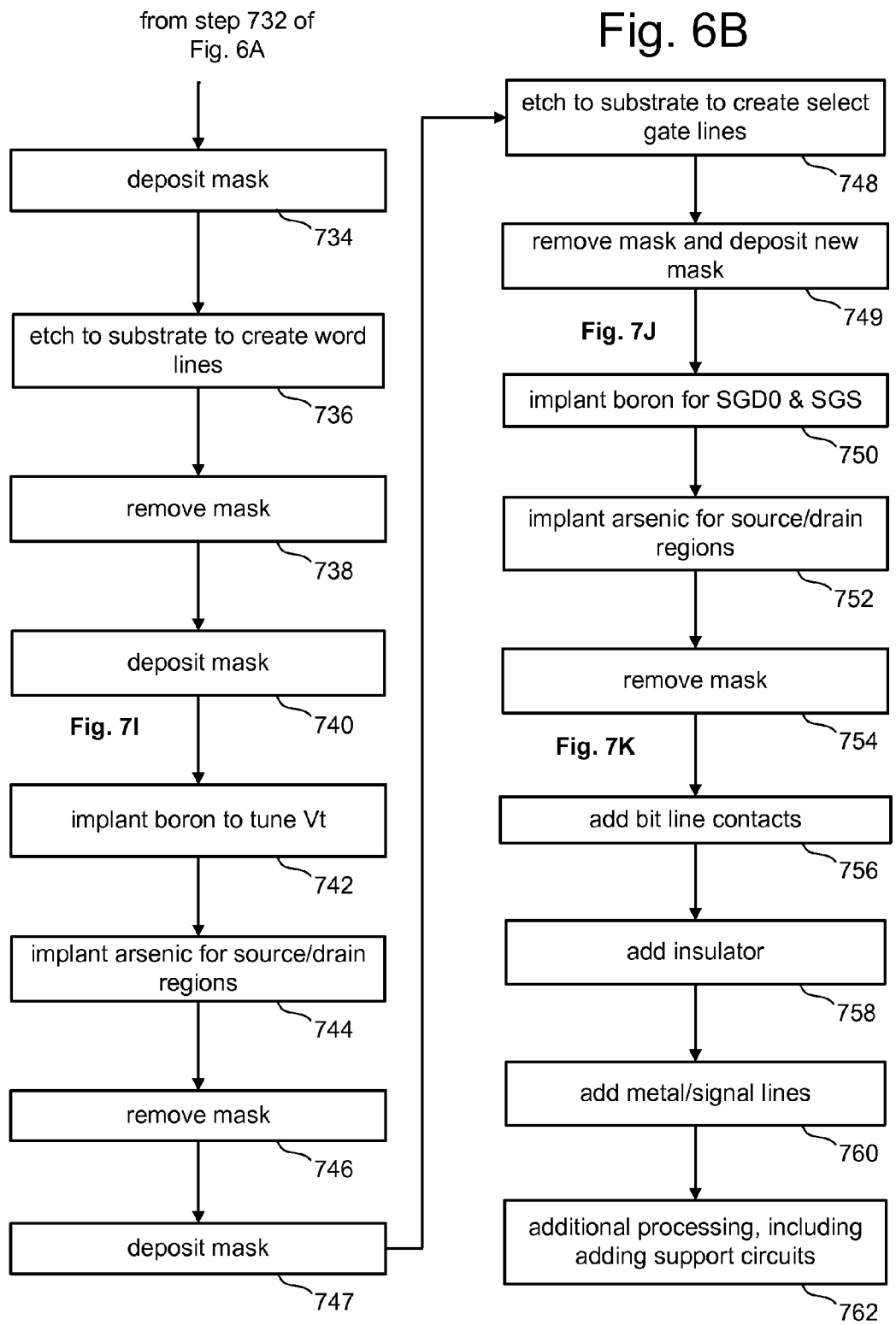

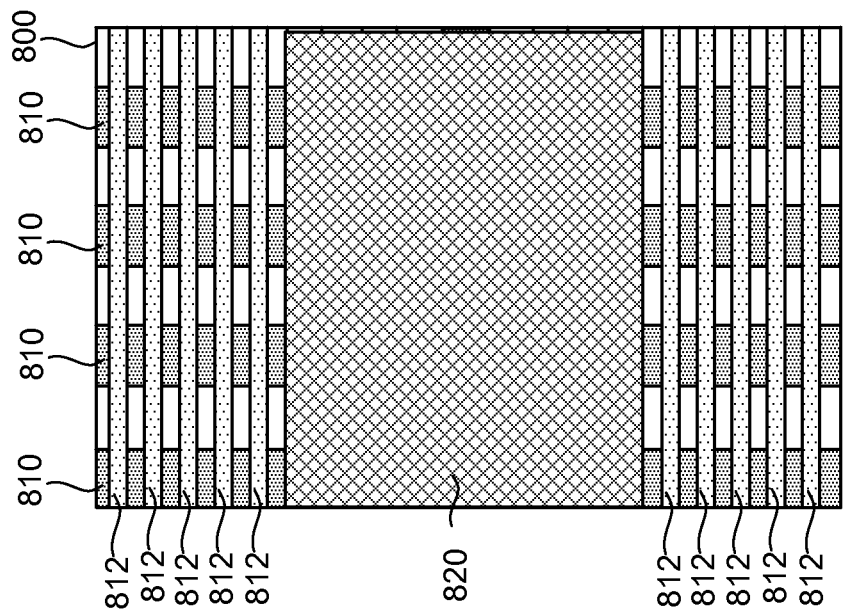
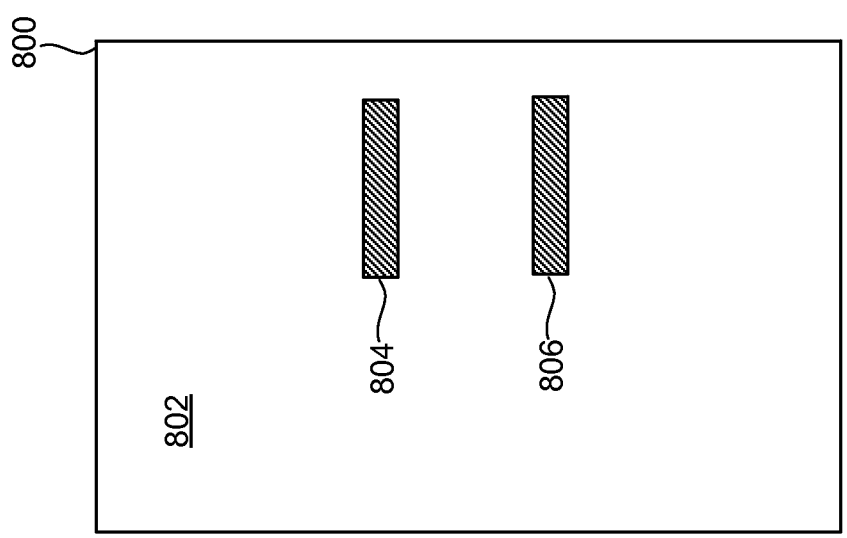

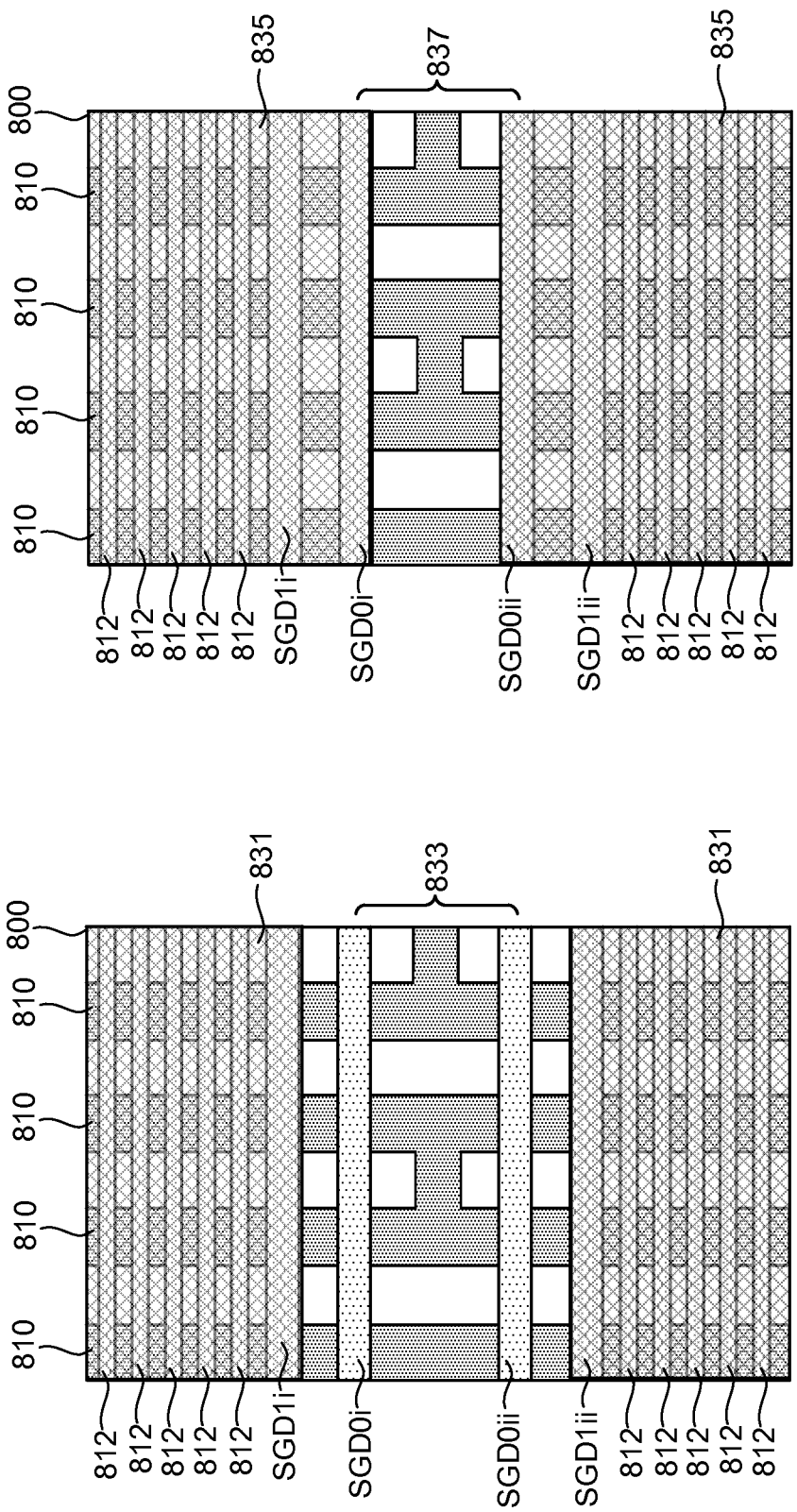

Fig. 14

|  | Program | Verify/Read |
|---|---|---|
| Vbl | 0v | Vsense |
| SGD0 | 0v | 0v |
| SGD1 | Vpgm | 1v |
| WL | Vpass | Vread |
| SGS | 0v | Vread |
| Source | 1v | 0v |

Fig. 15

|  | Program | Verify/Read |
|---|---|---|
| Vbl | 0v | Vsense |
| SGD0 | Vsgd | Vsg |
| SGD1 | 0v | 0v |
| WLn | Vpgm | Vcg |
| WLunselected | Vpass | Vread |
| SGS | 0v | Vsg |
| Source | Vdd | 0v |

Fig. 16

|  | Program | Verify/Read |
|---|---|---|
| Vbl | 0v | Vsense |
| SGD0 | 0v | 0v |
| SGD1 | Vsgd | Vsg |
| WLn | Vpgm | Vcg |
| WLunselected | Vpass | Vread |
| SGS | 0v | Vsg |
| Source | Vdd | 0v |

HYBRID NON-VOLATILE MEMORY CELLS FOR SHARED BIT LINE

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges. Therefore, the memory cell can be programmed/erased between two states: an erased state and a programmed state that correspond to data "1" and data "0." Such a device is referred to as a binary device.

A multi-state flash memory cell is implemented by identifying multiple, distinct allowed threshold voltage ranges for programmed memory cells. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Pat. No. 7,237,074, both of which are incorporated herein by reference in their entirety, describe various data encoding schemes for multi-state flash memory cells.

To increase the capacity of non-volatile storage systems and/or reduce the size of the systems, there has been a trend to shrink the area used to implement the memory structure. However, as process geometries shrink, many design and process challenges are presented

BRIEF DESCRIPTION OF THE DRAWINGS

FIGS. 6A and 6B depict a flow chart for manufacturing non-volatile memory.

FIG. 7A-7M depict non-volatile memory in various stages of the manufacturing process of FIGS. 6A-6B.

FIG. 14 is a table indicating voltages used to program select gates.

FIG. 15 is a table indicating voltages used to program and verify/read data non-volatile storage elements.

FIG. 16 is a table indicating voltages used to program and verify/read data non-volatile storage elements.

DETAILED DESCRIPTION

A non-volatile storage system is disclosed that includes pairs (or another number) of NAND strings (or other groupings of memory cells) in the same block being connected to and sharing a common bit line. By sharing bit lines, less bit lines are needed in the storage system. Using less bit lines reduces the space needed to implement the storage system. Each NAND string will have two (or more) drain side select gates. The non-volatile storage system will have two drain side selection lines each connected to one of the two drain side select gates so that the NAND strings (or other groupings of memory cells) sharing a bit line can be individually selected at the block level. To allow proper selection of a NAND string using the select gates, the select gates will be tuned to different threshold voltages. For example, for a first subset of NAND strings the first select gate will have a higher threshold than the first select gate for a second subset of NAND strings because the second subset of NAND strings will be subjected to implantation (e.g., using Arsenic) in the active areas (while the first subset of NAND strings was not subjected to the implantation). The second select gate for each NAND string will have a programmable threshold voltage so that Fowler-Nordheim tunneling (or another process) can be used to individually tune the second select gates. More details are discussed below.

Figure 1:
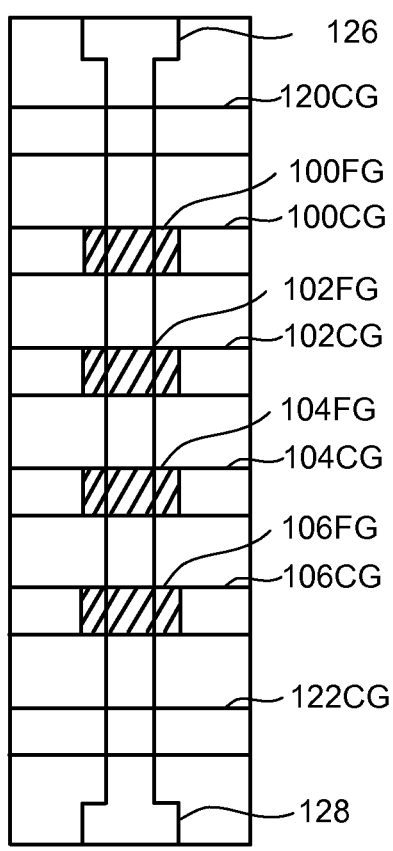
FIG. 1 is a top view of a prior art NAND string.
Figure 2:
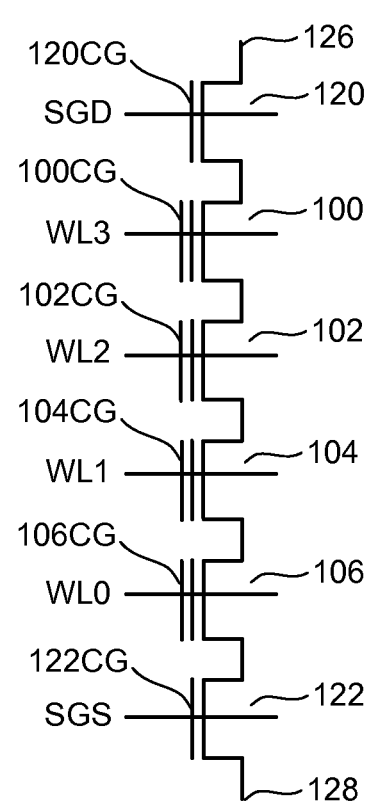
FIG. 2 is an equivalent circuit diagram of the prior art NAND string.

One example (but not the only example) of a non-volatile storage system that can be used to implement the technology described herein is a flash memory system that uses the NAND structure, which includes arranging multiple transistors in series (ie connected), sandwiched between two select gates. The transistors in series (data non-volatile storage elements) and the select gates are referred to as a NAND string. FIG. 1 is a top view showing one prior art NAND string. FIG. 2 is an equivalent circuit thereof. The NAND string depicted in FIGS. 1 and 2 includes four transistors 100, 102, 104 and 106 in series and sandwiched between a first (drain side)

select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is typically connected to the common source line by its source select gate controlled by select line SGS and connected to its associated bit line by its drain select gate controlled by select line SGD. The use of the terms connect, connected, and connection in this document can include a direct connection or an indirect connection. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. Other types of non-volatile storage devices, in addition to NAND flash memory, can also be used.

Figure 3:
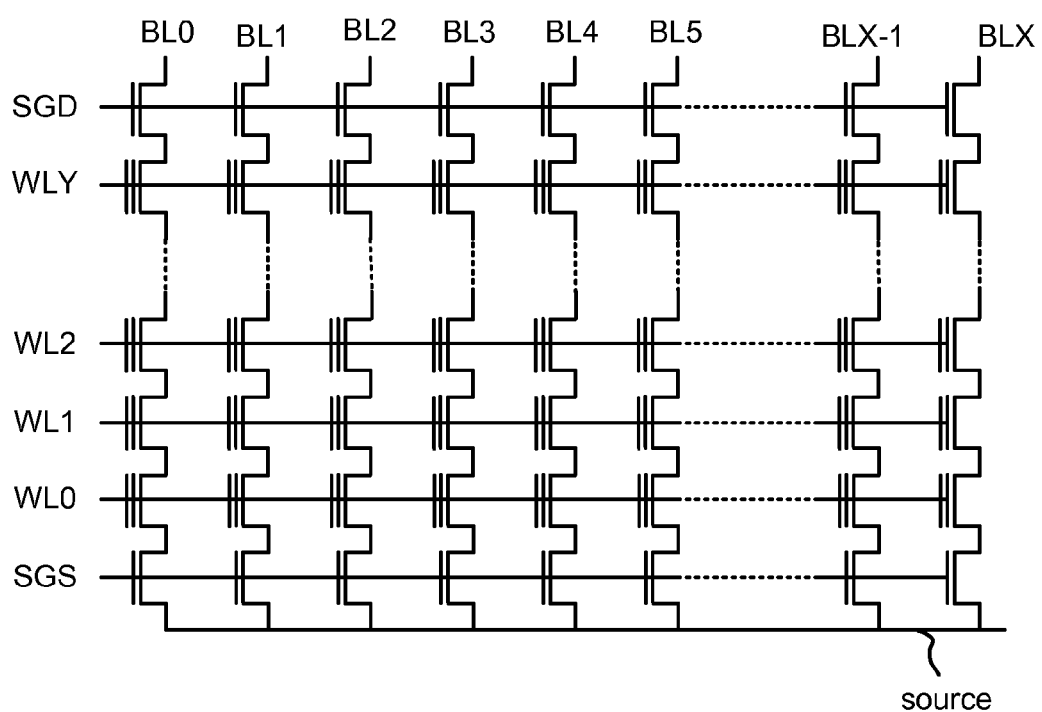
FIG. 3 is a block diagram depicting one embodiment of a block in a prior art memory array.

FIG. 3 provides one example of a block of memory cells implemented in prior art memory systems. As can be seen, each NAND string includes many memory cells. For example FIG. 3 shows each NAND string including Y memory cells. Each NAND string is connected to one bit line, has one drain side selection signal SGD, has one drain side select gate connected to the drain side selection signal SGD, one source side selection signal SGS, and one source side select gate connected to the source side selection signal SGS. All of the NAND strings depicted in FIG. 3 are connected to a common source line labeled as "source."

In order to save space on the semiconductor die, it is proposed that two NAND strings (or other grouping of memory cells) share a single (common) bit line. One proposal for having two NAND strings share a bit line includes using two select gates at the drain side (same side/end) of each NAND string in order to connect or disconnect a NAND string from the shared bit line. For example, FIG. 4 depicts a block in a memory array comprising NAND strings each having two select gates at the drain side (same side/end) of each NAND string in order to connect or disconnect a NAND string from the shared bit line.

Figure 4:
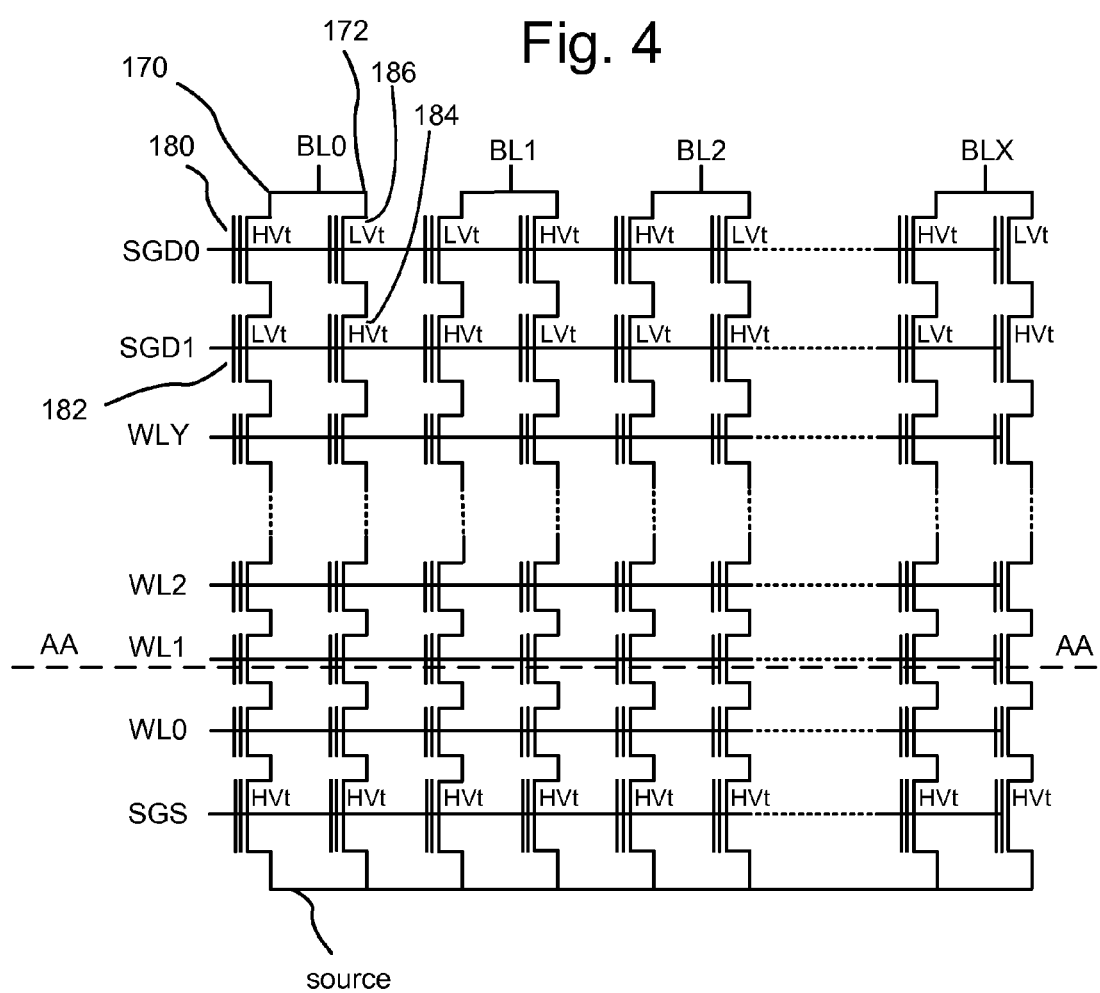
FIG. 4 is a block diagram depicting one embodiment of a block in a memory array according to the technology described herein.

FIG. 4 shows a block of non-volatile storage elements, including multiple groups of nonvolatile storage elements that each comprise multiple connected data nonvolatile storage elements and multiple select gates on a common side of the data nonvolatile storage elements. In one embodiment, the groups of nonvolatile storage elements are NAND strings.

FIG. 4 shows a block with X bit lines. Each bit line is connected to two NAND strings. In other embodiments, a bit line can be connected to more than two NAND strings. In the embodiment of FIG. 4, each NAND string includes a set of data nonvolatile storage elements connected to word lines WL0, WL1, ... WLY and a set of select gates. FIG. 4 shows, for each NAND string, one select gate on the source side of the data nonvolatile storage elements connected to selection signal SGS for allowing connection to the source line. FIG. 4 shows each NAND string having two select gates on the drain side of the data nonvolatile storage elements, with half of the drain side select gates connected to selection signal SGD0 and half of the drain side select gates connected to selection line SGD1. In other embodiments, there can be more than two drain side select gates per NAND string. In one embodiment, the transistors comprising the select gates are wider than the transistors comprising the data nonvolatile storage elements.

As described above, each NAND string includes two select gates on the drain side of the data nonvolatile storage elements. For example, bit line BL0 is connected to NAND string 170 and NAND string 172. NAND string 170 has select gates 180 and 182 on the drain side of the data nonvolatile storage elements connected to WL0, WL1, ... WLY. Select gate 180 is connected to selection line SGD0 and bit line BL0. Select gate 182 is connected to selection line SGD1, select gate 180 and the data nonvolatile storage element connected to word line WLY. NAND string 172 includes two select gates 184 and 186 on the drain side of the data nonvolatile storage elements. Select gate 186 is connected to selection line SGD0 and bit line BL0. Select gate 184 is connected to selection line SGD1, select gate 186 and the data nonvolatile storage element connected to word line WLY.

In one embodiment, select gates 180, 182, 184 and 186 are used in order to select one of NAND strings 170 and 172 to be connected to the common shared bit line BL0. One of the means for accomplishing this is to have the threshold voltages of the four select gates 180, 182, 184 and 186 set so that by appropriately biasing SGD0 and SGD1 the system can select one of NAND strings 170 and 172. In one embodiment, the select gates will be tuned to have either a low threshold voltages (e.g., in the neighborhood of −2 v) or a high threshold voltage (e.g., in the neighborhood of +1 v). In FIG. 4, the threshold voltage of the select gates is noted, with HVt representing a high threshold voltage and LVt representing a low threshold voltage. On any NAND string, one select gate will have HVt and one select gate will have LVt. For any one bit line, one of the select gates connected to SGD0 will have HVt and the other select gate connected to SGD0 will have LVt and one of the select gates connected to SGD1 will have LVt and the other select gate connected to SGD1 will have HVt. In this manner, NAND string 170 can be selected for electrical connection to bit line BL0 by driving 3 (or more) volts on SGD0 and 0 volts on SGD1. By asserting 3 (or more) volts on SGD0, select gate 180 and select gate 186 will both turn on. By driving 0 volts on SGD1, select gate 182 will turn on but select gate 184 will not turn on; therefore, NAND string 172 will be cut off from bit line BL0, while NAND string 170 is in electrical communication with bit line BL0.

In one embodiment, the select gates connected to SGD1 have the structure of a data non-volatile storage, and can have their threshold voltages erased to the LVt and programmed to the HVt (or otherwise programmed). The select gates connected to SGD0 can have the same structure as the select gates connected to SGD1 or can have their control gate shorted to the floating gate so they are not non-volatile storage. In either instance, the threshold voltage of the select gates connected to SGD0 can be tuned using one or more implantation steps during manufacture.

Figure 5:
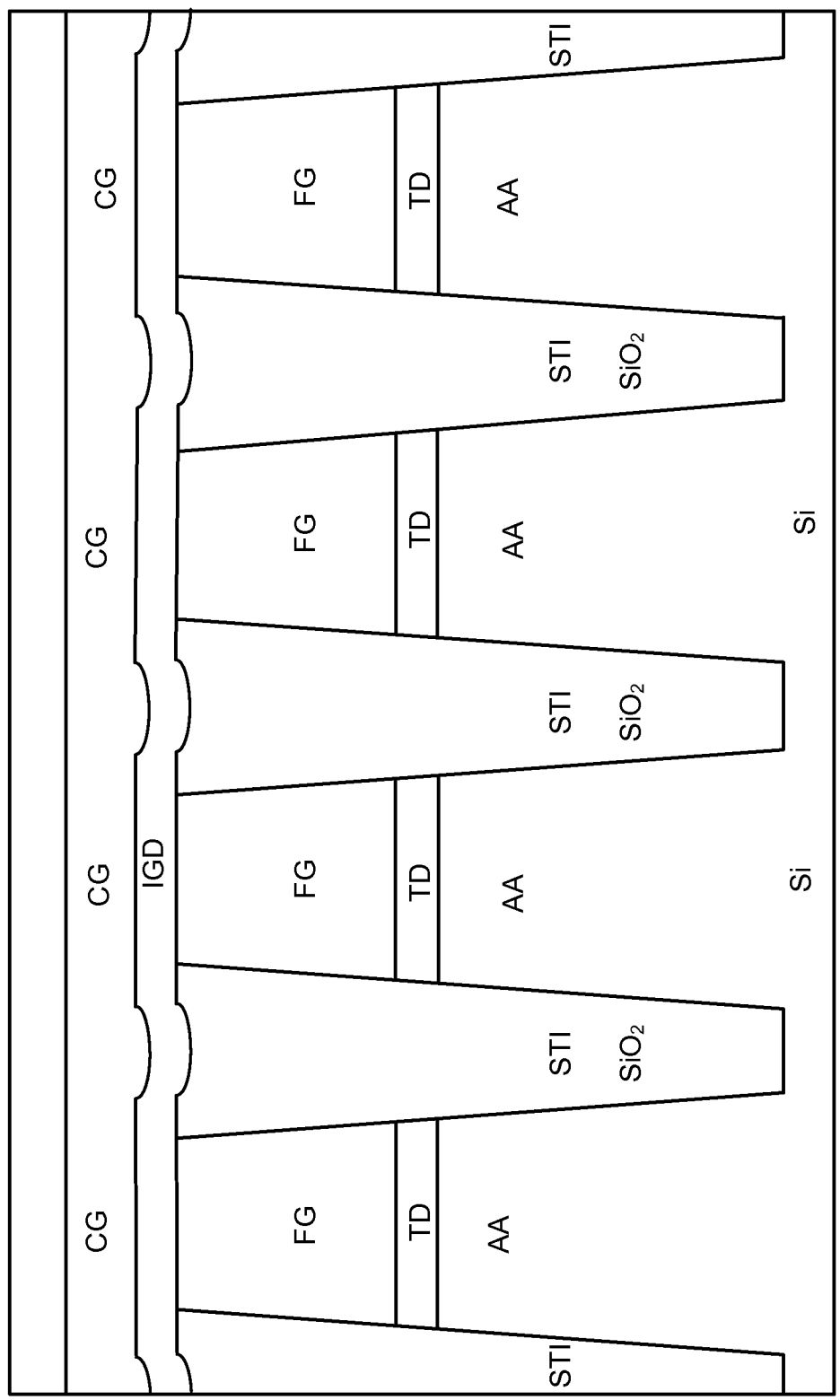
FIG. 5 depicts a cross section of FIG. 4, along the line marked AA.

In one embodiment, the transistors used on the NAND strings of FIG. 4 have a somewhat flat profiles. That is, in some prior art systems, the transistors of the NAND string are implemented such that the control gate will wrap around the floating gate. In another embodiment, the control gate is somewhat flat and does not wrap around the floating gate. FIG. 5 depicts a cross section, along dashed line AA of FIG. 4, of the transistors of a set of NAND strings. That is, FIG. 5 shows a cross section across multiple NAND strings. FIG. 5 shows the silicon substrate (Si) for which the NAND strings are positioned. Each of the NAND strings is built on an active area (AA) of the silicon substrate. Between active areas are shallow trench isolation areas (STI), which are filled with $SiO_2$. The top portion of the active areas (AA) function as the channels of the NAND strings and the individual transistors. On top of the active areas (AA) are tunnel dielectric regions (TD), which may be formed of $SiO_2$ or another substance. Above the tunnel dielectric (TD) is the floating gate (FG). In one embodiment, the floating gate is a single layer of polysilicon. In another embodiment, the floating gate can be multiple layers. For example, the floating gate can include four layers: a lower layer of polysilicon, a second layer that comprises a dielectric (e.g., $SiO_2$), a third layer serving as a charge trap layer (e.g., $HfO_2$), and a top layer of dielectric material (e.g., $SiO_2$). Above the floating gates (FG), is the word line which serves as the control gate (CG). Between the floating gates (FG) and the control gates (CG) is an inter-gate dielectric region IGD. The profile of the control gate (CG) is relatively flat. It can be noticed from FIG. 5 that above the shallow trench isolation regions (STI), there is a small dip in the bottom of the control gate. However, this dip is much smaller than prior art control gates.

FIG. 6A and FIG. 6B depict a flowchart which describes a portion of one embodiment of a process fabricating a non-volatile storage system using the technology described herein. For ease of discussion, the process of FIGS. 6A and 6B will be described in relation to the embodiment of FIGS. 4 and 5. FIGS. 7A-7L depict a portion of a memory system in various stages of the fabrication process of FIGS. 6A-6B and will be referred to during the discussion of FIGS. 6A-B. FIGS. 7B, 7C, 7D, 7F, 7G and 7H depict a cross section taken along dashed line AA of FIG. 4. FIGS. 7A, 7E, 7I, 7J, 7K and 7L provide top views.

Note that FIGS. 6A and 6B are flowcharts describing only a portion of the front end process for manufacturing of non-volatile storage devices, which covers only steps only as far as forming some of the M1 metal layers. These flows do not cover all of the fabrication steps and one of ordinary skill in the art would understand the additional steps needed. There are many ways to manufacture memory according to the present invention and, thus, it is contemplated that various methods other than that described by FIGS. 6A and 6B can be used. While a flash memory chip will consist of both peripheral circuitry, which includes a variety of low, medium and high voltage transistors, and the core memory, the process steps of FIGS. 6A and 6B are only intended to describe in general terms a possible process recipe for the fabrication of a portion of the core memory array. Many known photolithography, etch, implant, diffusion, and oxidation steps that are intended for the fabrication of the peripheral transistors are omitted.

Step 700 of FIG. 6A includes performing implants and associated anneals of the triple well. The result of step 302 includes a p-substrate, an n-well within the p-substrate and a p-well within the n-well. The n-well depth is typically much thicker than that of the p-well. The p-substrate is usually the thickest consisting of the majority of the wafer thickness.

As mentioned above, some of the select gates connected to SGD0 are intended to have a lower threshold voltage. For example, looking at FIG. 4, select gate 186 is intended to have a threshold voltage of LVt. In step 702, arsenic is implanted in the active areas of the substrate (active area implantation), prior to the creating of the floating gate stacks, at the future locations of those select gates connected to SGD0 that are intended to have a lower threshold voltage. For example, the active area of the substrate below where select gate 186 is created would have been implanted with arsenic. FIG. 7A shows a mask 802 used for step 7A. Mask 802 includes apertures 804 and 806 to allow arsenic implantation.

In step 704, a tunnel dielectric layer is deposited on top of the p-well. In one embodiment, the tunnel dielectric is made of $SiO_2$. In step 706, one or more floating gate layer is deposited over the dielectric layer using CVD, PVD, ALD, or another suitable method. In one embodiment, the floating gate is a single layer of polysilicon. In another embodiment, the floating gate can be multiple layers. For example, the floating gate can include four layers: a lower layer of polysilicon, a second layer that comprises a dielectric (e.g., SiO2), a third layer serving as a charge trap layer (e.g., HfO2), and a top layer of dielectric material (e.g., SiO2).

Figure 7B:
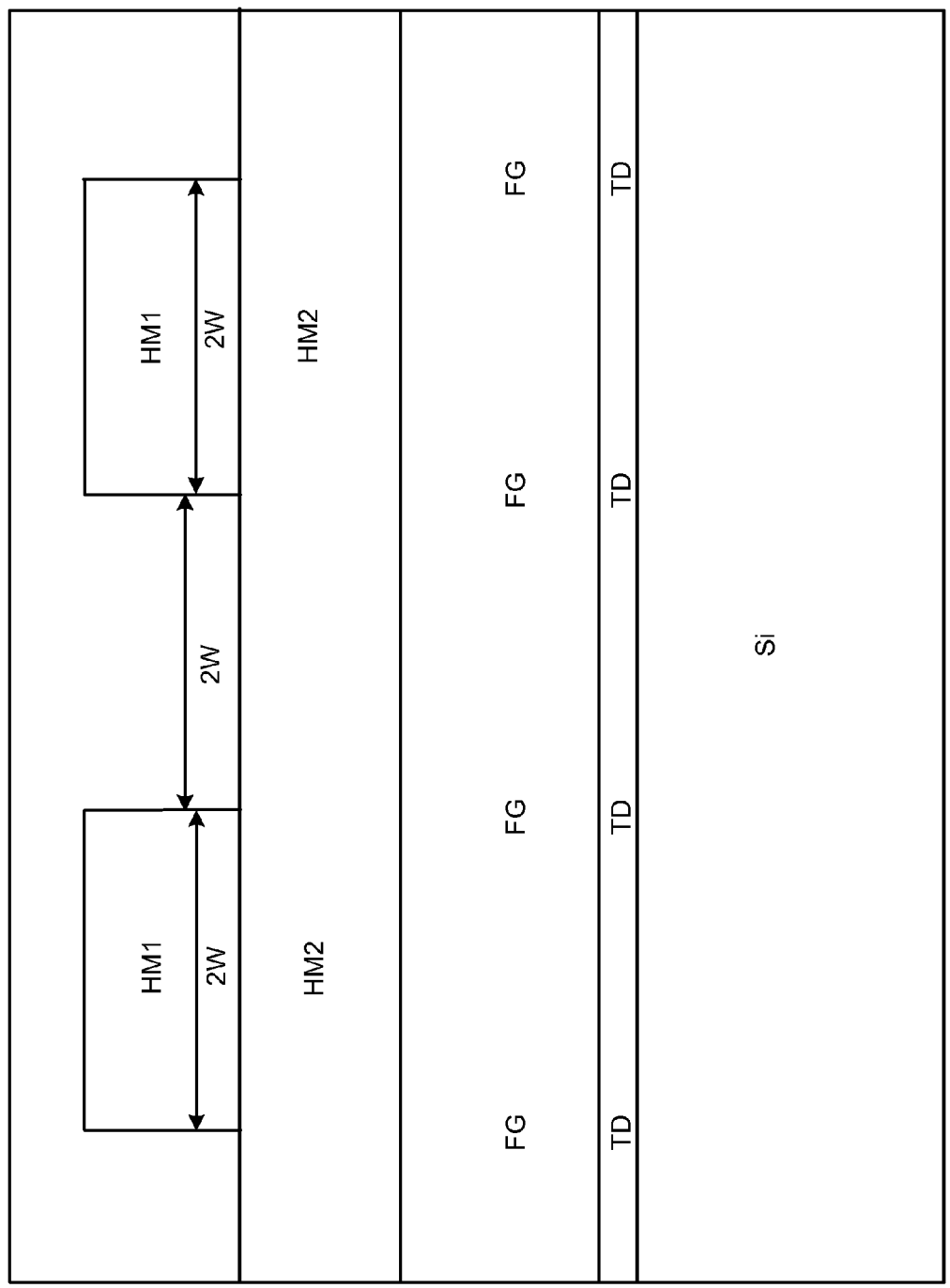

In step 708, one or more hard mask layers (such as $SiO_2$, SiN, $SiO_xN_y$, and carbon oriented materials) are deposited using, for example, a CVD or Spin Coat process. In one embodiment, two hard masks (HM1 and HM2) are deposited over the floating gate layer. In one example implementation, the two hard mask layers include seven layers: (1) silicon on glass (SOG), (2) an Anti-Reflective Coating (ARC) that is organic below the SOG, (3) a high temperature oxide layer below the organic carbon layer, (4) a CVD oriented oxide [e.g., Tetra-ethyl oxide silicate (TEOS) or LP-CVD] layer below the a high temperature oxide, (5) a Silicon Nitride layer below the CVD oriented oxide layer, (6) another CVD oriented oxide layer below the Silicon Nitride layer and (7) another Silicon Nitride layer below the second CVD oriented oxide layer. The top four layers (1)-(4) comprise the top hard mask HM1 and the bottom three layers (5)-(7) comprise the bottom, hard mask HM2. In other embodiments, other structures for one or more hard masks can also be used. In step 710, photoresist and photolithography are used to form strips of the top hard mask HM1 that was deposited in step 708. FIG. 7B shows the results after step 710. As can be seen, the silicon substrate area (Si) is depicted along with the tunnel dielectric layer TD, floating gate layer FG, bottom hard mask HM2 and the strips of top hard mask HM1. In this embodiment, the width of the strips of top hard mask HM1 are 2W. The spacing between top hard masks HM1 is also 2W.

Figure 7C:
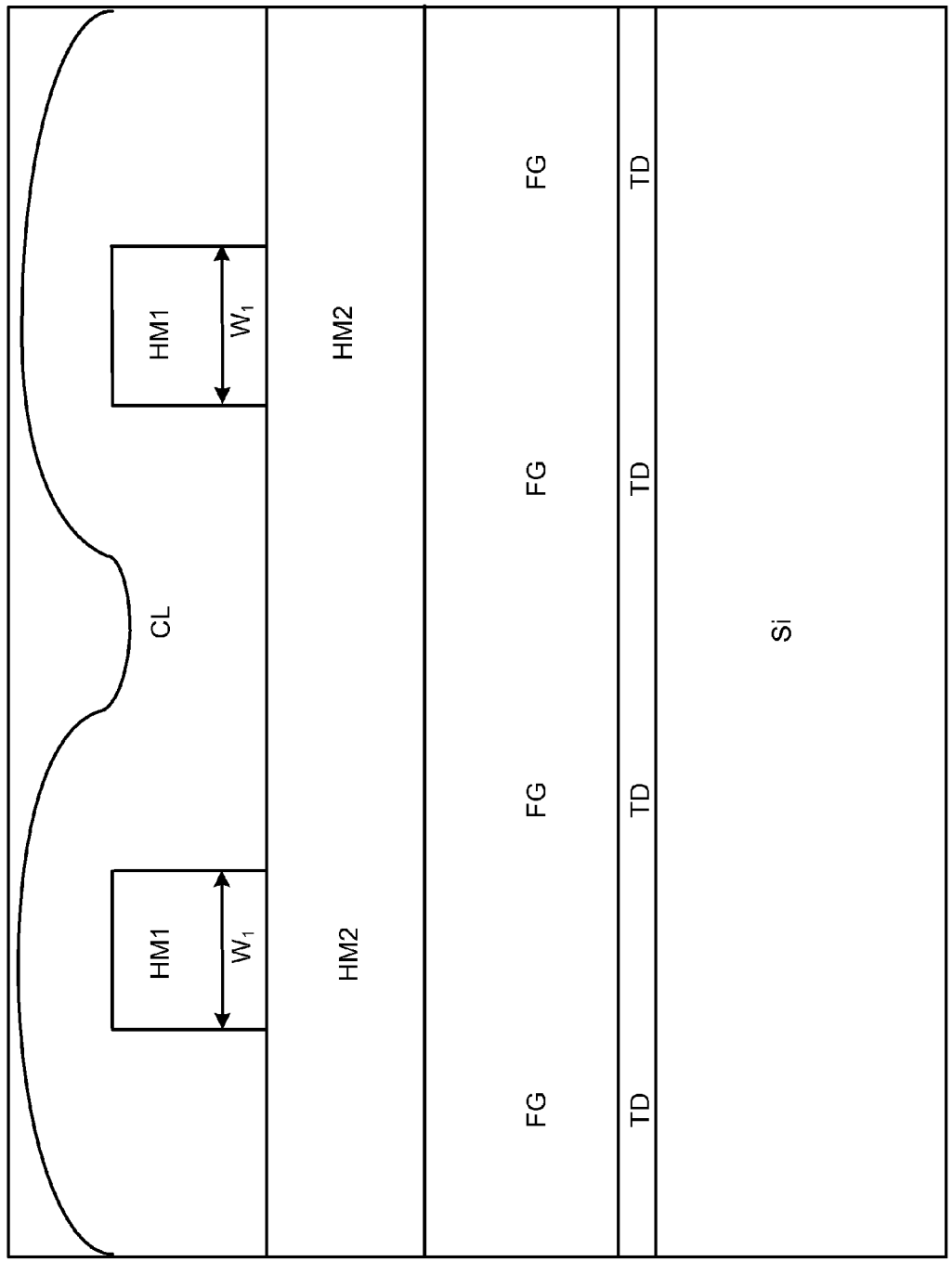

In step 712, a slimming process is performed to reduce the width of the top hard masks HM1 to a width of $W_1$. In some embodiments, $W_1$ is equal to W. In other embodiments, $W_1$ can be smaller or larger than W. In one embodiment the slimming process is performed using $O_2$. In step 714, a conformal layer is deposited on top of the floating gate layer FG and hard mask strips HM1. Based on etch selectivity to hard mask HM1 material, appropriate material can be picked for the conformal layer. FIG. 7C shows a portion of the memory system after step 714, depicting the hard mask HM reduced to a width of $W_1$ and the conformal layer CL deposited on top of the hard mask strips HM. At this point, the spacing between hard mask strips HM is $2W+(2W-W_1)$.

Figure 7D:
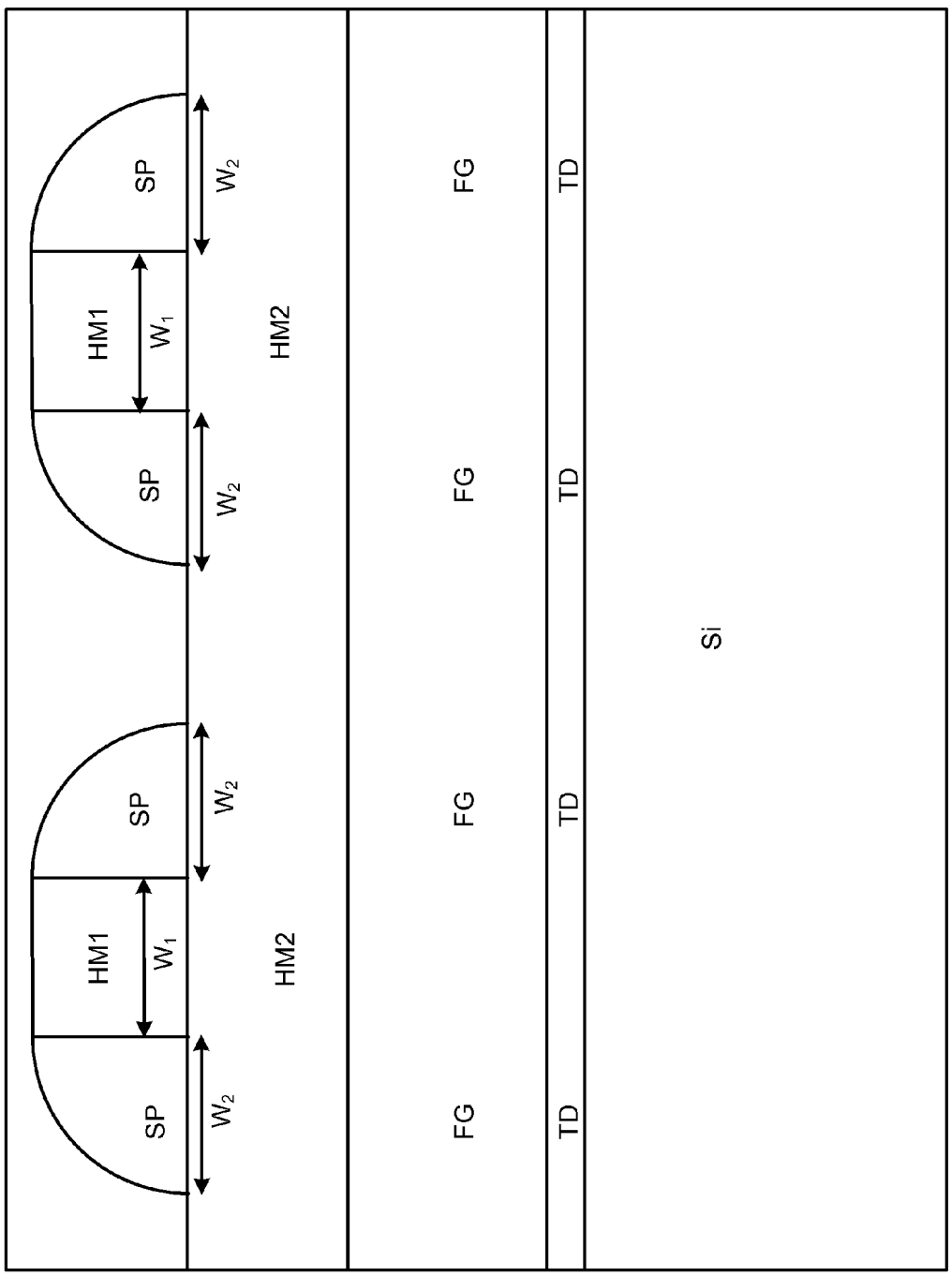
Figure 7E:
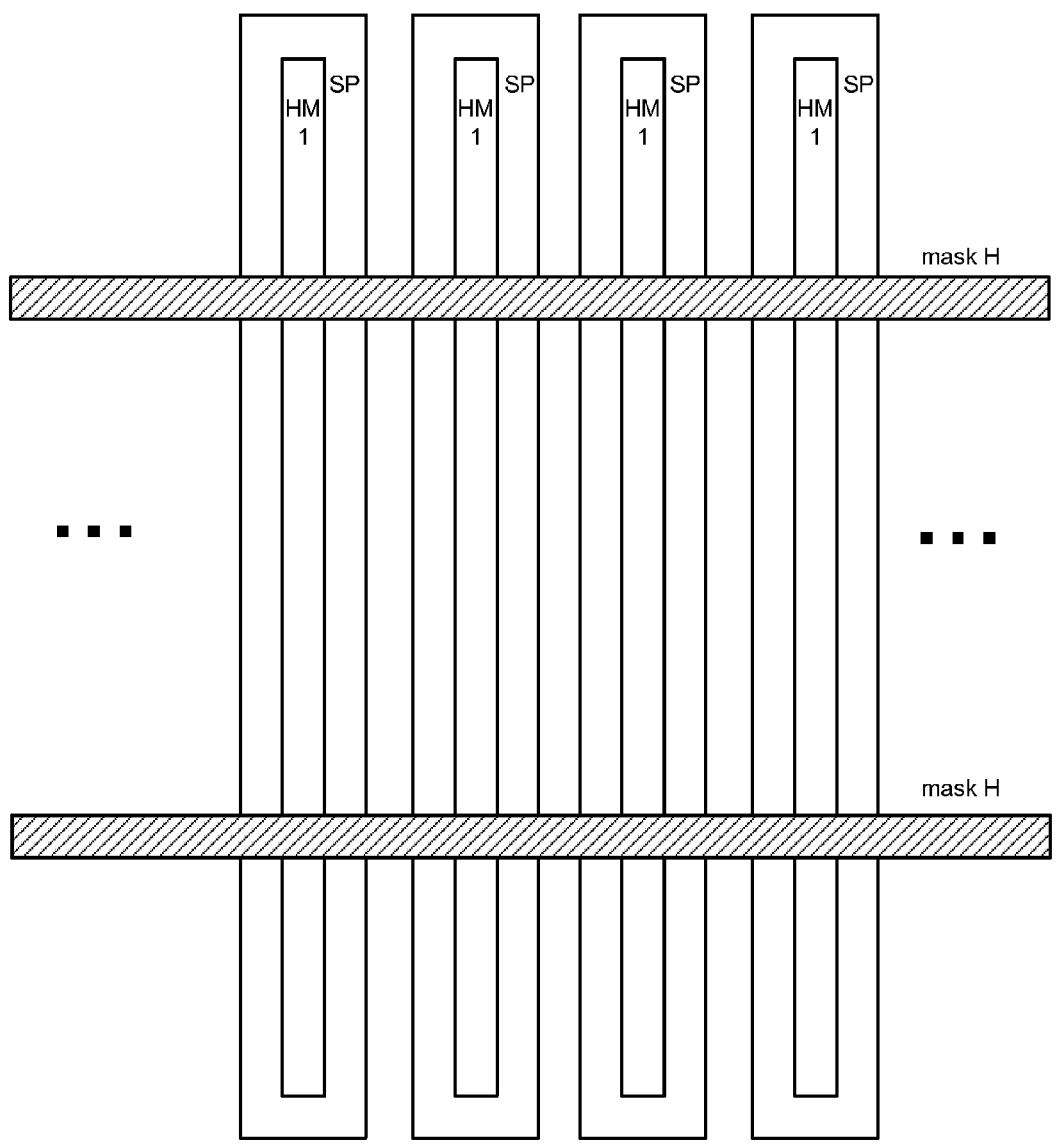

In step 716, spacers are created by performing anisotropic etching in a vertical direction only. The result of step 716 is depicted in FIG. 7D, which shows each hard mask strip HM1 surrounded by spacers SP. The spacers have a width of $W_2$. In one embodiment $W_2$ is wider than $W_1$, while in another embodiment $W_2$ is narrower than $W_1$. When the hard mask strips HM1 were formed, they were formed in continuous strips across the entire memory array. FIG. 7E is a top view of a portion of a memory array showing a plurality of hard mask strips HM1 surrounded by spacers SP. In step 717, horizontal strips of hard mask (mask H) are deposited across the hard mask strips HM1, as can be seen in FIG. 7E. The areas where horizontal strips of hard mask (mask H) intersect HM1 are the location for the bit line contacts. It is at the bit line contact that two adjacent NAND strings in the same block will connect to the same bit line.

Figure 7F:
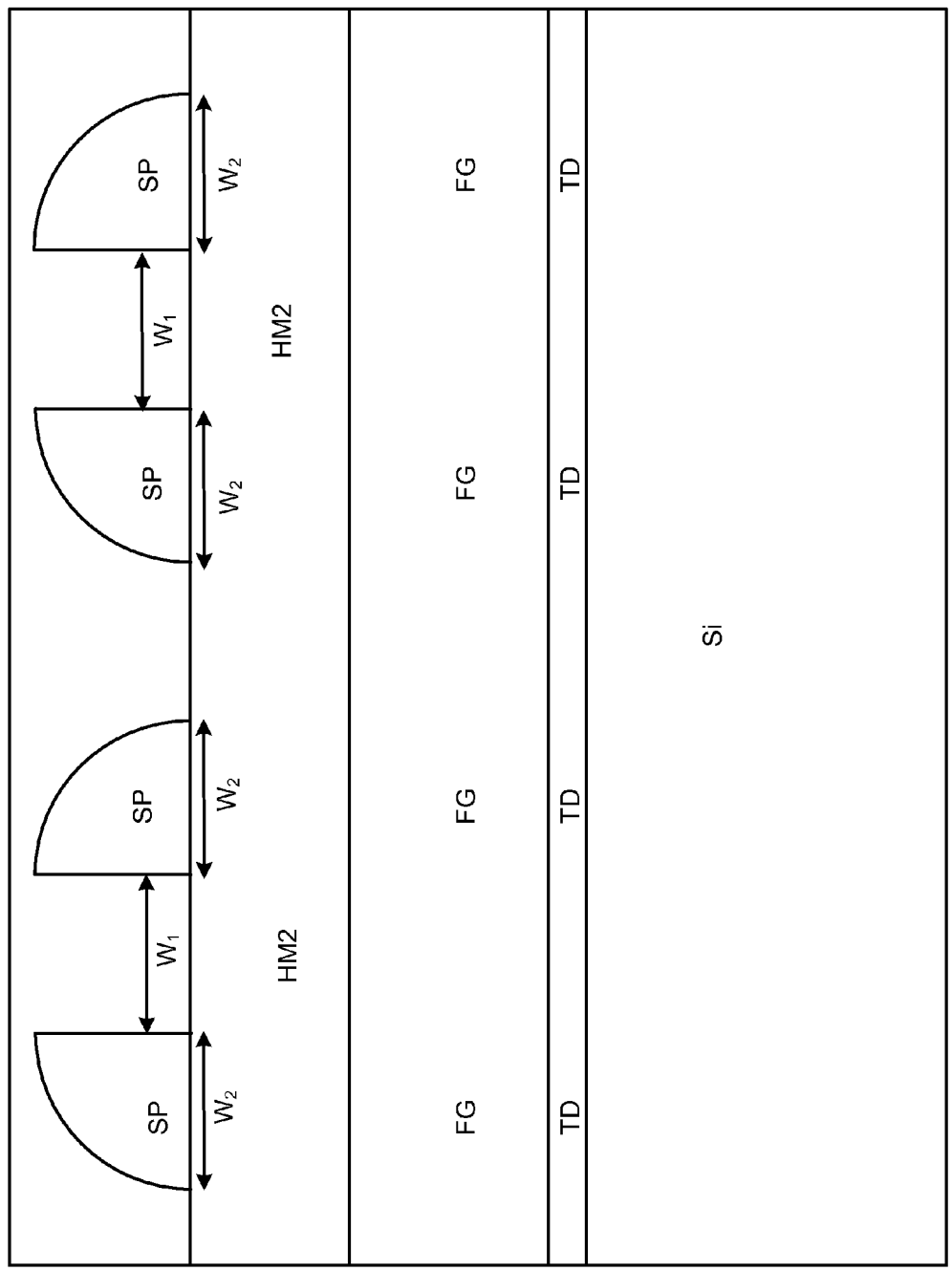
Figure 7G:
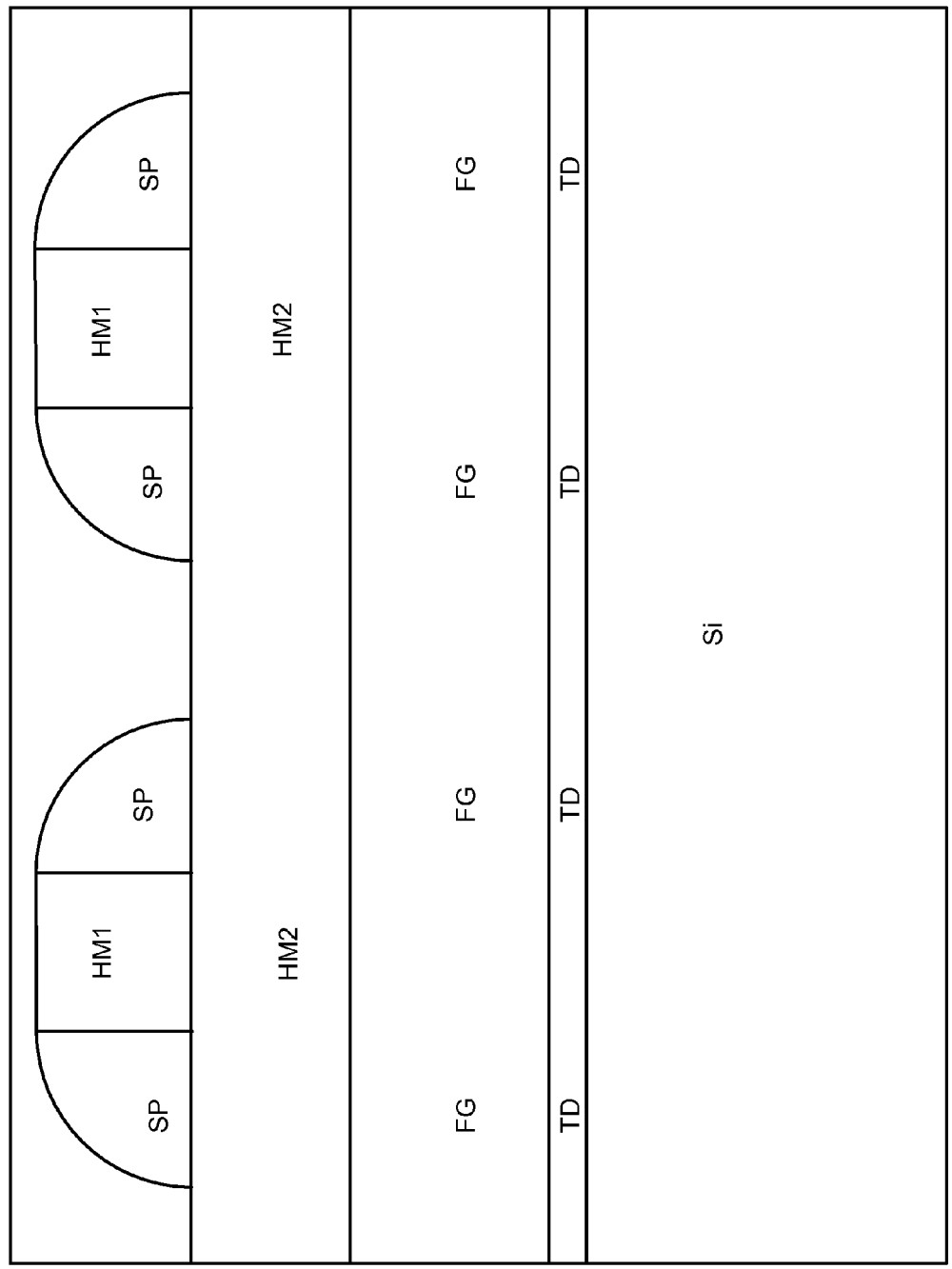
Figure 7H:
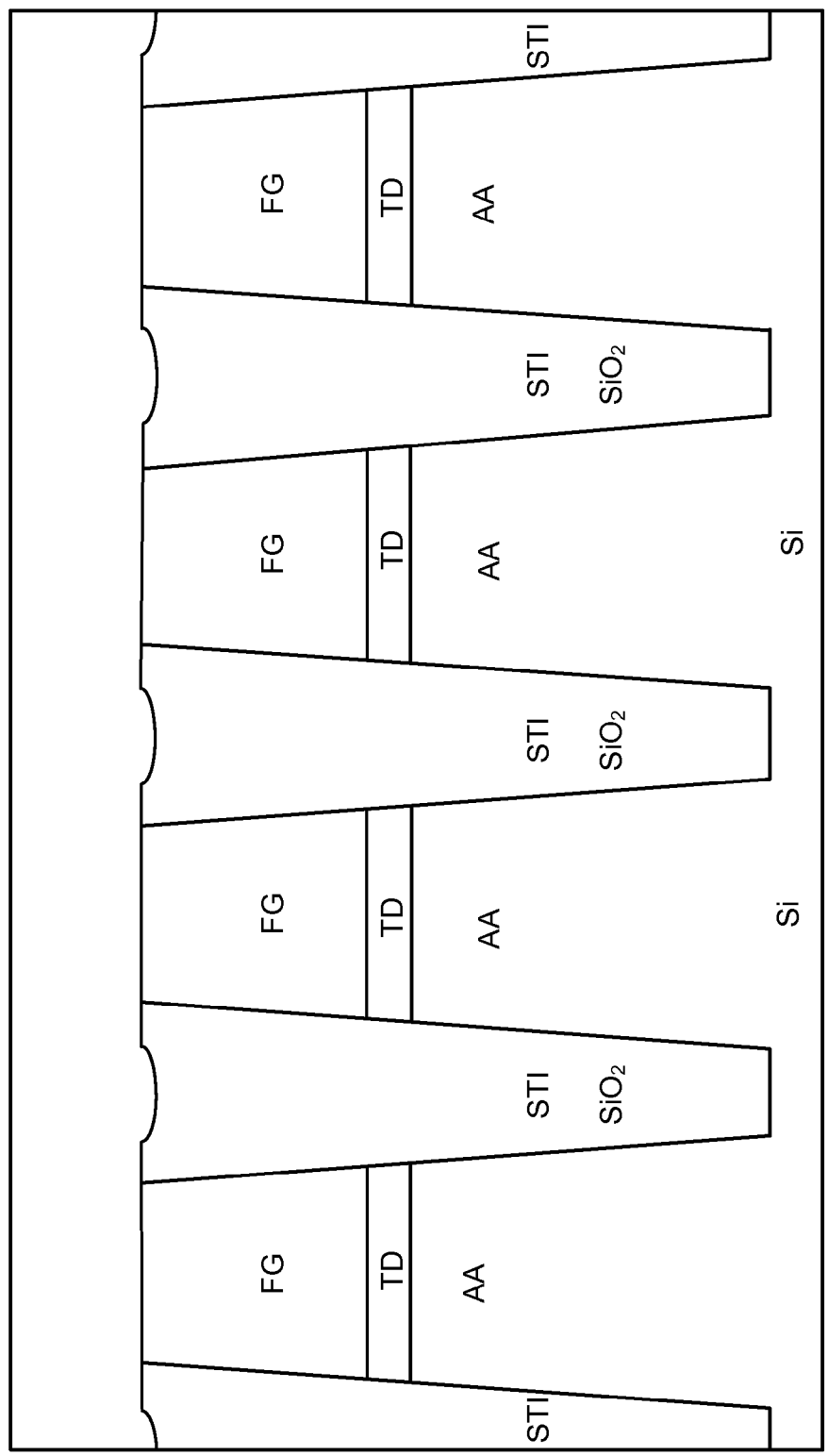

In step 718 of FIG. 6A, the top hard mask HM1 strips are removed using the appropriate wet chemical etch that will remove hard mask strips HM1 but not the spacers SP or mask H. Therefore, the portions of HM1 below mask will not be removed. FIG. 7F depicts the structure after step 718 in a location that is not under mask H so that HM1 was removed. In step 719, horizontal strips of hard mask (mask H) are removed. FIG. 7G depicts the structure after step 719 in a location that was under mask H so that HM1 was not removed. In step 720, a Reactive Ion Etch (RIE) will be used to etch between spacers, through the bottom hard mask HM2, through the floating gate layer, through the tunnel dielectric layer and into the silicon to form shallow trench isolation (STI) areas between spacers. The STI areas are inside the silicon area Si. In step 722, the spacers are removed using any suitable process known in the art. In step 724, the STI areas are filled with oxide. In step 725, the oxide is polished using a chemical mechanical polish process (CMP). In step 726, the bottom hard mask layer is removed using a wet chemical etch (e.g., using $H_3PO_4$). In step 728, the oxide is etched back to remove the oxide down to a level near the top of the FG stack. The result of step 728 is depicted in FIG. 7H, which shows the oxide in the STI up to a level that is a little below the FG stack. In step 730, the inter-gate dielectric layer is deposited using, for example ALD or CVD process. The inter-gate dielectric layer can be formed by using materials such as $SiO_2$, ONO, $HfO_2$, $Al_2O_3$ or any other high-k material(s) (e.g., not just limited to these), or any combination of such materials. In step 732, a control gate layer (CG) is deposited. In one embodiment, the floating gate layer FG and the control gate layer CG are both made of polysilicon. The results of step 732 are depicted in FIG. 5. After step 732, the process continues at step 734 FIG. 6B.

In step 734 of FIG. 6B, a mask is deposited and patterned to create the word lines. The purpose of the mask is to define the word lines. In step 736, an etching process (e.g. RIE) is performed down to the substrate. Therefore, the etching process will remove portions of control gate, integrate dielectric IGD, floating gate and tunnel dielectric (which together will form floating gate stacks). This step will break up the strips of active area of a NAND string into separate data non-volatile storage devices (memory cells) and floating gate stacks. In step 738, the mask applied in step 734 is removed.

In step 740, a mask is deposited to allow for an implant step for the data non-volatile storage devices (memory cells), without performing the implant for the select devices. For example, FIG. 7I shows portion 800 of the memory system with mask 820 covering the area where selection lines SGD0, SGD1$i$, SGD0$ii$ and SGD1$ii$ will be and exposing the word lines 812. In step 742 boron is implanted, using an angular implant process, in order to raise and tune the threshold voltages of the data non-volatile storage devices (memory cells). In step 744 arsenic is implanted, using a straight implant process, in order to create source/drain regions of the data non-volatile storage devices (memory cells). In step 746, the mask (e.g., mask 820) deposited in step 740 is removed.

Figure 7K:
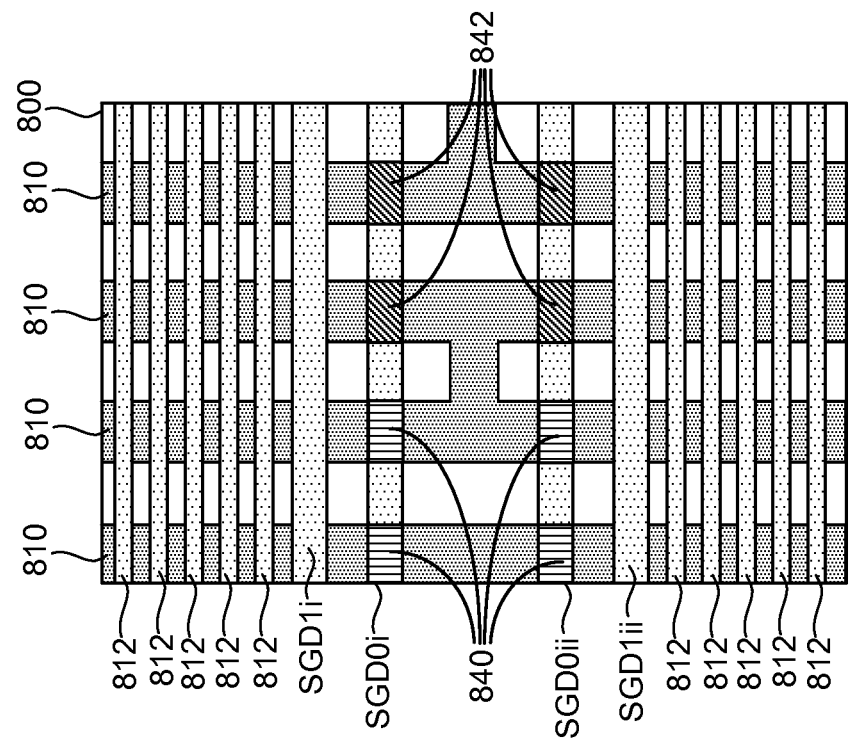
Figure 7J:
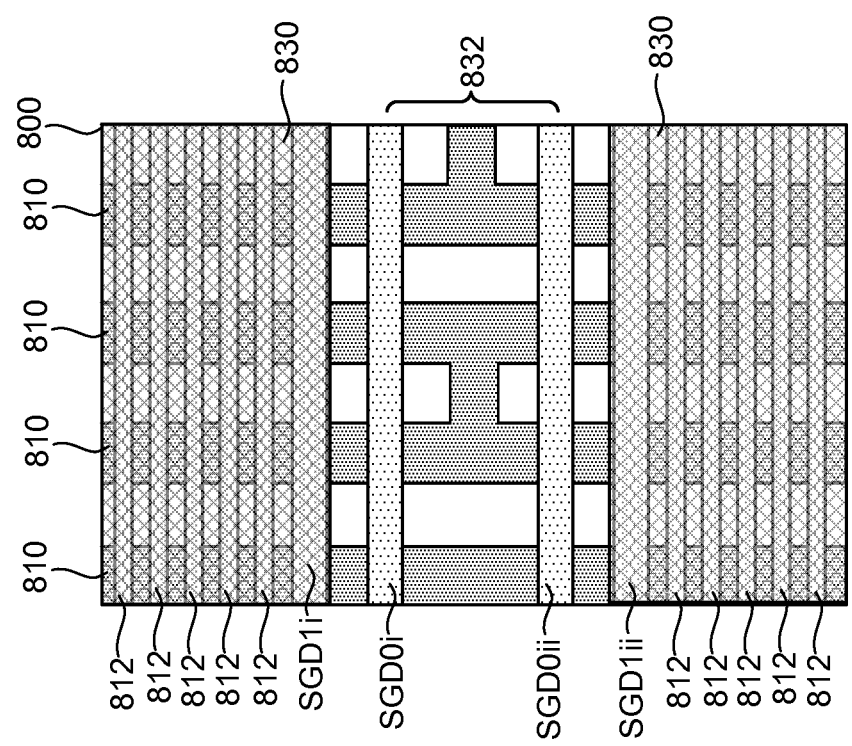

In step 747, a mask is deposited to define the select gate lines (e.g., SGD0, SGD1$i$, SGD0$ii$ and SGD1$ii$ and SGS). In step 748, an etching process (e.g. RIE) is performed down to the substrate to create the select gate lines. In step 749, the mask from step 747 is removed and a new mask is deposited to allow for an implant step for the select gates connected to SGD0, without performing the implant for the data non-volatile storage devices (memory cells) and select gates connected to SGD1. For example, FIG. 7J shows portion 800 of the memory system with mask 830 covering the word lines, SGD1$i$, SGD1$ii$ and data non-volatile storage devices (memory cells), while exposing selection lines SGD1$i$ and SGD1$ii$. In step 750 boron is implanted, using an angular implant process, in order to raise and tune the threshold voltages of the select gates connected to SGD0$i$ and SGD0$ii$ and also SGS. In step 752 arsenic is implanted, using a straight implant process, in order to create the source/drain regions of the select gates. In step 754, the mask (e.g., mask 830) deposited in step 748 is removed. The result of step 754 is depicted in FIG. 7K, which shows portion 800 of the memory system. Select gates 842 have a threshold voltage of LVt, as select gates 842 were subjected to the active area implantation of step 702 since select gates 842 correspond to the portion of the substrate underneath apertures 804 and 806 (see FIG. 7A). Select gates 840 have a threshold voltage of HVt, as select gates 840 were not subjected to the active area implantation of step 702 since select gates 840 correspond to the portion of the substrate underneath mask 802 (see FIG. 7A).

Note that when it is said that select gates 842 have a threshold voltage of LVt, it is likely that there is some process variation such that the threshold voltage of all select gates 842 will not have the exact same threshold voltage, but the threshold voltages will be very close to each other. A similar principle applies to select gates 840 and HVt.

In step 756, the bit line contacts are created. In step 758, an insulator is added between SGDE and SGDO. In one embodiment, the insulator is $SiO_2$. In another embodiment, SiN, SiO/SiN combination or Air-gap formation can be used. In step 760, the appropriate metal and signal lines are added to the memory. In step 762, additional processing is performed to include the relevant support circuits and the necessary devices.

Figure 8:
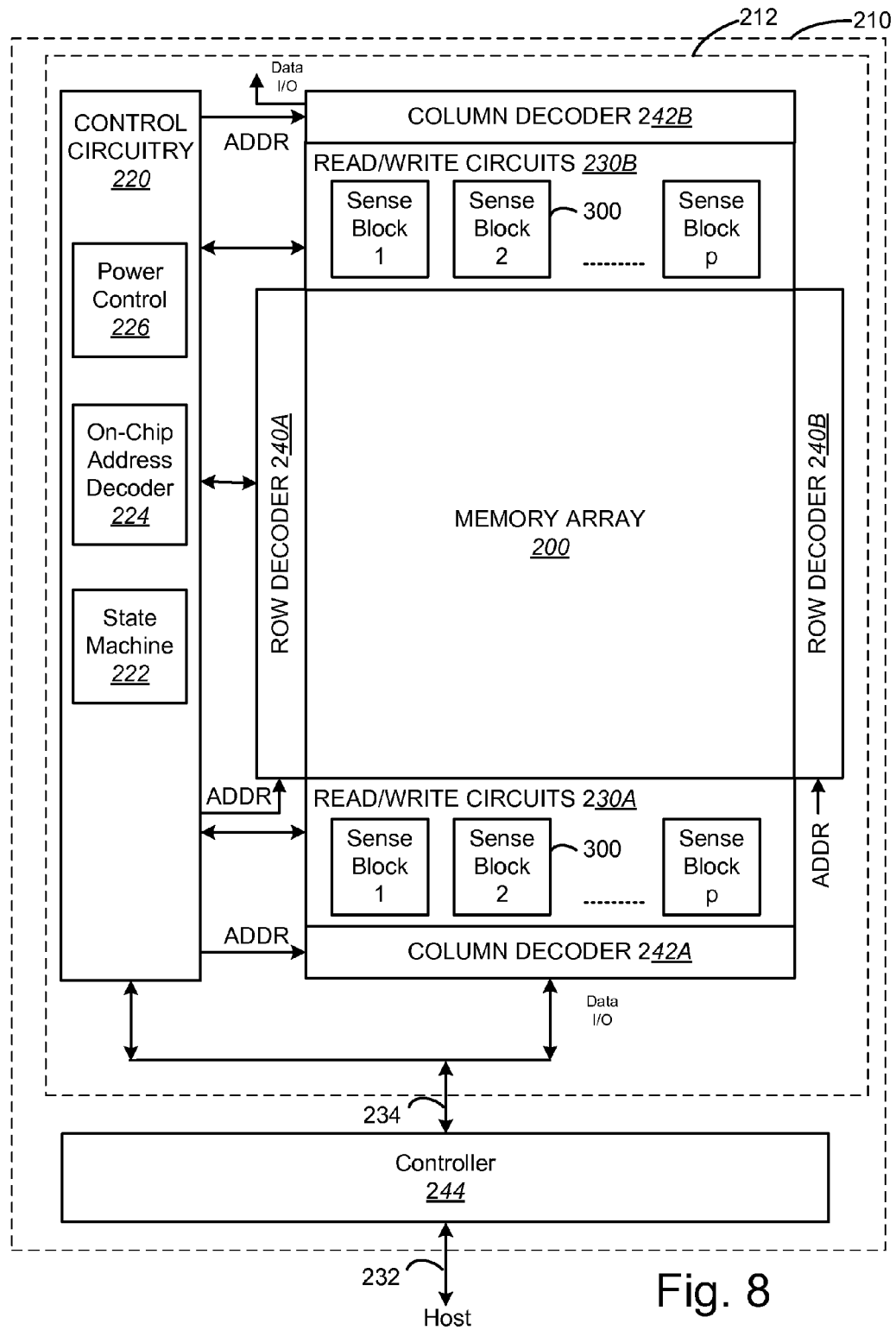
FIG. 8 is a block diagram of a non-volatile memory system.

FIGS. 7L and 7M show an alternative embodiment for steps 747-754. The mark of step 747 is depicted in FIG. 7L as mask 831, covering the word lines but not the area where the select lines (SGD0 and SGD1) are to be created. The select lines are then created (as per step 748) and then the source/drain regions are created by implanting arsenic (similar to step 752). After the source/drain regions are created, a new mask, mask 835 of FIG. 7M, is deposited that covers the word lines and select lines, but exposes the area 837 between SGDO's and the area between SGS's. Boron is implanted, using an angular implant process, in order to raise and tune the threshold voltages of the select gates connected to SGD0i and SGD0ii and SGS FIG. 8 illustrates a memory device 210 having read/write circuits for reading and programming a page (or other unit) of memory cells (e.g., NAND multi-state flash memory) in parallel, including read and programming select gates as described herein. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a Controller 244 is included in the same memory device 210 (e.g., a removable storage card or package) as the one or more memory die 212. Commands and data are transferred between the host and Controller 244 via lines 232 and between the Controller 244 and the one or more memory die 212 via lines 234. In one embodiment, Controller 244 include a data storage (Controller memory), a memory interface for interfacing with the memory chip/die and one or more processes in communication with the data storage and memory interface.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein, including reading and programming memory cells and select gates.

In one embodiment, an array of memory cells 200 is divided into a large number of blocks (e.g., blocks 0-1023, or another amount) of memory cells. As is common for flash memory systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. Controller 244 (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 9:
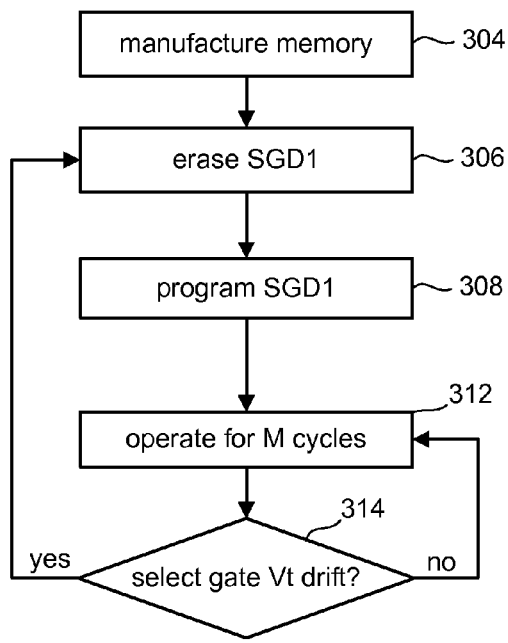
FIG. 9 is a flow chart describing one embodiment of a process for using a non-volatile memory system.

FIG. 9 is a flow chart describing one embodiment of a process for making and using non-volatile memory. In step 304 of FIG. 9, the memory system is manufactured using processes known in the art, including the processes of FIGS. 6A and 6B. As discussed above, in order to be able to use selection line SGD1 to independently select one of the multiple NAND strings connected to a common shared bit line, it is needed (in one embodiment) to perform non-volatile programming of at least a subset of the drain side select gates connected to SGD1. In one embodiment, before programming any of the select gates, all of the select gates connected to SGD1 are erased in step 306 using processes known in the art for erasing non-volatile storage elements. In one embodiment, the select gates SGD1 are erased such that there threshold voltage are set to approximately −2 volts or another LVt. In step 308, at least a subset of select gates connected to selection line SGD1 will be programmed. In one embodiment, the select gates that are programmed have their threshold voltage set at approximately 1 volt or other HVt. More information about step 308 will be provided below. The select gates connected to SGD0 do not need to be programmed because their threshold voltages were set during manufacturing, as explained above with respect to FIGS. 6A and 6B. In another embodiment, the threshold voltages of select gates connected to SGD0 can be fine tuned using programming.

In step 312, the memory system will be operated for M cycles, where M is an integer. Each cycle includes programming data non-volatile storage elements and erasing those data non-volatile storage elements. The variable M can be set based on simulation. For example, M could be equal to 100 cycles, 1,000 cycles, 10,000 cycles, etc. In other embodiments, rather than operating for M cycles, step 312 can include operating for a particular period of time. In step 314, the system tests whether the threshold voltage of the select gates that were programmed in steps 308 and 310 have drifted by an amount such that they no longer function properly to select a single NAND string connected to a bit line. If the threshold voltage of the select gates is acceptable for normal operation, then the system will operate for another M cycles (step 312) and then test again in step 314. If the threshold voltage of the select gates that were programmed in steps 308 and 310 have drifted by an amount that can cause an error or other problem, the process will loop back to step 306 in order to erase the select gates and re-program according to the flow chart of FIG. 9.

Figure 10:
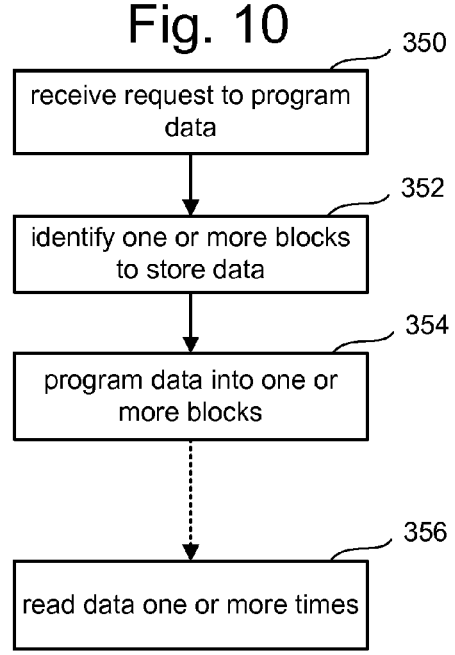
FIG. 10 is a flow chart describing one embodiment of a process for operating non-volatile memory.

FIG. 10 is a flow chart describing one embodiment of a process for operating non-volatile memory, such as the system of FIG. 8 (or other systems). In one embodiment, the process of FIG. 10 is performed as part of step 312 of FIG. 9. In step 350, a request to program data is received. The request can be from a host, another device or the controller. The request can be received at the controller, control circuitry, state machine, or other device. In response to the request, the controller, control circuitry, state machine, or other device, in step 352, will determine which block of flash memory cells will be used to store the data. In step 354, the data will be programmed into the determined block by performing any appropriate programming process that uses the select gates described above, some of which have been subjected to the non-volatile programming described herein. The programmed data will be read one or many times in step 356. The read process will also operate the select gates described above, some of which have been subjected to the non-volatile programming described herein. There is a dashed line between steps 354 and 356 because an unpredictable amount of time may pass between the steps, and step 356 is not performed in response to step 354. Rather, step 356 is performed in response to a request to read the data or other event.

Figure 11:
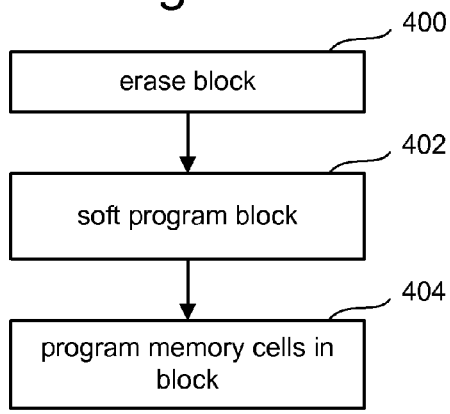
FIG. 11 is a flow chart describing one embodiment of a process for programming a non-volatile memory system.

FIG. 11 is a flow chart describing a programming process for programming memory cells in a block. FIG. 11 is one embodiment of step 354 of FIG. 10. In step 400, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by a Fowler-Nordheim tunneling mechanism. As electrons are transferred from the floating gate to the p-well region, the threshold voltage of the selected memory cells are lowered. Erasing can be performed on the entire memory array, on individual blocks, or another unit of cells. Other techniques for erasing can also be used. In step 402, soft programming is (optionally) performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 404, the memory cells of the block are programmed as described herein. In one embodiment, step 404 includes programming memory cells connected to many or all word lines for a block.

The process of FIG. 11 can be performed at the direction of the State Machine 222, Controller 244 or combination of State Machine 222 and Controller 244, using the various circuits described above. For example, the controller may issue commands and data to the state machine to program the data. In response, the state machine may operate the circuits described above to carrier out the programming operations.

The embodiment of FIG. 9 discussed above includes programming the select gates before operation, and then adjusting the select gates (if necessary) during operation. Another embodiment includes programming the select gates every time, or a subset of times, that the system performs an erase operation.

Figure 12:
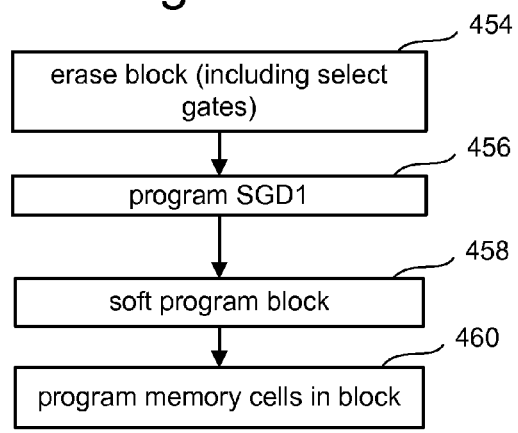
FIG. 12 is a flow chart describing one embodiment of a process for programming non-volatile memory.

Another embodiment includes programming the select gates as part of a programming process for data non-volatile storage elements. FIG. 12 is a flow chart describing another embodiment for programming non-volatile memory. FIG. 12 is an alternative method as compared to FIG. 11 and implements an embodiment where the select gates are programmed every time (or a subset of times) when there is a data programming operation being performed). The process of FIG. 12 is another embodiment of step 354 of FIG. 10. Additionally, the process of FIG. 12 can be performed at the direction of the state machine 222, controller 244 or a combination of the state machine 222 and controller 244, using the various circuits described above. For example, the controller may issue commands and data to the state machine to program the data. In response the state machine may operate the circuits described above to carrier out the programming operations.

In step 454 of FIG. 12, the system will erase the entire block chosen for programming. Step 454 includes also erasing the select gates connected to SGD1. For example, the select gates may be erased to have a threshold voltage of −2 volts (or other suitable threshold voltage). In step 456, a subset of select gates connected to SGD1 will be programmed (e.g., using non-volatile programming). In one embodiment, the select gates that are programmed have their threshold voltage set at approximately 1 volt or other HVt. In step 458, the block performs soft programming, as discussed above. In step 460, the data non-volatile storage elements in the block are programmed as per the data from the host.

Figure 13:
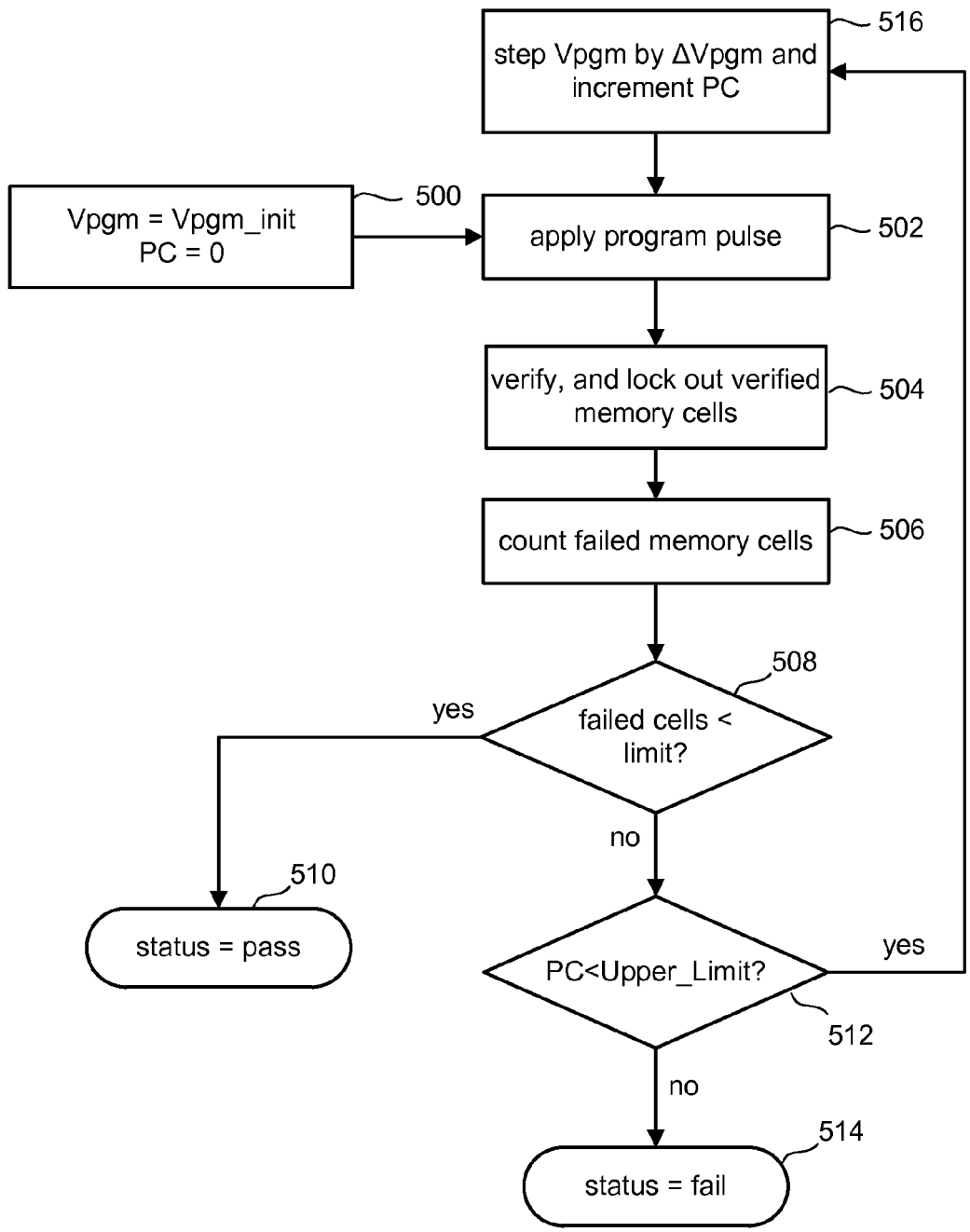
FIG. 13 is a flow chart describing one embodiment of a process for programming memory cells connected to a common word line.

FIG. 13 is a flow chart describing one embodiment of a process for performing programming on one or more memory cells connected to a common word line. Therefore, when programming a block of memory cells the process of FIG. 13 can be performed one or more times for each word line of the block. The process of FIG. 13 can be performed one or multiple times during step 404 of FIG. 11 or step 462 of FIG. 12. The process of FIG. 13 can also be used to program the select gates. Therefore, FIG. 13 depicts one example implementation of step 308 and 310 of FIG. 9, as well as steps 456 and 458 of FIG. 12.

In step 500 of FIG. 13, the programming voltage (Vpgm) is initialized to the magnitude (e.g., ~12-16V or another suitable level) of the initial programming pulse, as determined and instructed by the Controller. In other embodiments, the State Machine or other component can determine the magnitude of the initial programming pulse. In addition, step 500 includes initializing a program counter PC maintained by state machine 222 to 0.

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size, referred to as $\Delta$Vpgm. In step 502 of FIG. 13, a program pulse of the program signal Vpgm is applied to the selected word line (the word line selected for programming). In one embodiment, the memory cells being programmed are all connected to the same word line (the selected word line). The unselected word lines receive one or more boosting voltages (e.g., ~9 volts) to perform boosting schemes known in the art in order to avoid program disturb. There are many different boosting schemes that can be used with the technology described herein. In one embodiment, if a memory cell should be programmed, then the corresponding bit line is grounded. On the other hand, if the memory cell should remain at its current threshold voltage, then the corresponding bit line is connected to Vdd to inhibit programming. In step 502, the program pulse is concurrently applied to all memory cells connected to the selected word line so that all of the memory cells connected to the selected word line that should be programmed are programmed concurrently. That is, they are programmed at the same time (or during overlapping times). In this manner all of the memory cells connected to the selected word line will concurrently have their threshold voltage change, unless they have been locked out from programming.

In step 504, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 506, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks 300 (see FIG. 8) will store the status (pass/fail) of their respective memory cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total counted, which reflects the total number of memory cells currently being programmed that have failed the last verify step. In another embodiment, separate counts are kept for each data state.

In step 508, it is determined whether the count from step 506 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 510. In this situation, enough memory cells programmed correctly such that the few remaining memory cells that have not been completely programmed can be corrected using ECC during the read process. In some embodiments, step 506 will count the number of failed cells for each sector, each target data state or other unit, and those counts will individually or collectively be compared to a threshold in step 508. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 512 and the program counter PC is checked against an Upper Limit value. Examples of an Upper Limit value are 20 or 26; however, other values can be used. If the program counter PC is not less than the Upper Limit value, then the program process is considered to have failed and a status of FAIL is reported in step 514. If the program counter PC is less than the Upper Limit value, then the process continues at step 516 during which time the Program Counter PC is incremented by 1 and the program voltage Vpgm is stepped up to the next magnitude. For example, the next pulse will have a magnitude greater than the previous pulse by a step size (e.g., a step size of 0.1-0.7 volts). After step 516, the process loops back to step 806 and another program pulse is applied to the selected word line.

During verify operations (e.g., step 504) and read operations, the selected word line is connected to a voltage, a level of which is specified for each read operation (e.g., Vra, Vrb, and Vrc,) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line voltage. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

FIG. 14 is a table that identifies that voltages used for programming and verifying (or reading) select gates connected to SGD1. The voltages depicted in the table of FIG. 14 for programming select gates are applied during step 502 of FIG. 13, when the process of FIG. 13 is used to implement step 308 of FIG. 9 or step 456 of FIG. 12. During programming, the bit line voltage Vbl is set to 0 volts (Vdd for Inhibit BLs), SGD0 receives 0 volts, SGD1 received Vpgm (the program pulse), all of the word lines receive Vpass (e.g., 7-10 volts), SGS receives 0 volts and the source line is set at 1 volt.

The voltages depicted in the table of FIG. 14 for verifying select gates are applied during step 504 of FIG. 13, when the process of FIG. 13 is used to implement step 308 of FIG. 9 or step 456 of FIG. 12. During a verify operation, the bit line voltage Vbl is set to Vsense (e.g., 0.2 volts-0.8 volts), SGD0 receives 0 volts, SGD1 received 1 volt, all of the word lines receive Vread (e.g., 7-10 volts), SGS receives Vread and the source line is set at 0V.

As discussed above, to program the data non-volatile storage elements (connected to WL0, WL1, ... WLY), the system will perform the process of FIG. 13 to implement step 404 of FIG. 11 or step 462 of FIG. 12. FIG. 15 shows the voltages applied to program data non-volatile storage elements that are in NAND strings whose select gate connected to SGD0 has a threshold voltage of HVt. The voltages for programming listed in FIG. 15 are applied during step 502 of FIG. 13. The bit line will receive 0 volts (Vdd for inhibit BLs) during step 502, SGD0 receives Vsgd, SGD1 receives 0 volts, the selected word line for programming (the word line connected to the data non-volatile storage element being programmed) receives Vpgm (the program pulse), the unselected word lines receive Vpass, SGS receives 0V, and the source line receives Vdd. When verifying during step 504 of FIG. 13 (or reading), the bit line voltage Vbl will be set to Vsense, SGD0 receives Vsg (ie ~3-7 volts), SGD1 receives 0 volts, the selected word line WLn receives Vcg (the read compare voltage), the unselected word lines receive Vread, SGS receives Vsg, and the source line receives 0 volts.

FIG. 16 is a table listing voltages applied during step 502 and 504 of FIG. 13 when the process of FIG. 13 is used to implement steps 404 of FIG. 11 and 462 of FIG. 12. The voltages listed in FIG. 16 are used when programming, verifying or reading data non-volatile storage elements on NAND strings whose select gate connected to SGD0 has a threshold voltage of LVt. When programming (step 502), the bit line Vbl receives 0 volts (Vdd for Inhibit BLs), SGD0 receives 0 volts, SGD1 receives Vsgd, the selected word line WLn receives Vpgm (the program pulse), the unselected word lines receive Vpass, SGS receives 0V, and the source line receives Vdd. When verifying or reading (step 504), the bit line Vbl receives Vsense, SGD0 receives 0 volts, SGD1 receives the Vsg, the selected word line WLn receives Vcg, the unselected word lines receive Vread, SGS receives Vsg, and the source line receives 0 volts. The voltages listed in the tables of FIGS. 15 and 16 provide for programming and reading the group/NAND strings of data non-volatile storage elements based on the tuning of the select gates described herein. Note that the voltages listed in FIGS. 14-16 are applied by the one or more managing circuits described above.

One embodiment of a non-volatile storage apparatus comprises a plurality of groups of connected non-volatile storage elements, a plurality of bit lines and a plurality of word lines. Each group of the plurality of groups comprises multiple connected data non-volatile storage elements and multiple select gates on a common side of the data non-volatile storage elements. The multiple select gates on the common side comprise a first select gate and a second select gate. The first select gate having a first threshold voltage for a first subset of the groups and a second threshold voltage for a second subset of the groups due to active area implantation for the second subset of groups that causes the second threshold voltage to be lower than the first threshold voltage. The second select gate of each group having a programmable threshold voltage. Each of the plurality of bit lines are connected to multiple groups of the plurality of groups of connected non-volatile storage elements. Each of the word lines are connected to all of the groups of the plurality of groups of connected non-volatile storage elements.

One embodiment of a process for preparing non-volatile storage comprises: performing implantation in an active area of a substrate to provide for a lower threshold voltages of to be created select gates; creating floating gate stacks for a plurality of groups of connected non-volatile storage elements, each group comprises multiple connected data non-volatile storage elements and multiple select gates on a common side of the data non-volatile storage elements, the multiple select gates on the common side comprise a first select gate and a second select gate, the implantation in the active area is performed for the first select gate for a subset of the groups; creating word lines; after creating the word lines, performing implantation at the first select gate for each of the plurality of groups of connected non-volatile storage elements in order to raise threshold voltages of the first select gate for the groups; and creating bit lines that are each connected to multiple groups of the plurality of groups of connected non-volatile storage elements.

One embodiment of a process for operating a non-volatile storage comprises: with respect to multiple groups of non-volatile storage elements that each comprise multiple connected data non-volatile storage elements in series with two select gates on a common side of the data non-volatile storage elements and the two select gates include a first select gate and a second select gate, performing non-volatile programming of the second select gates for a subset of groups, the first select gate having a first threshold voltage for a first subset of the groups and a second threshold voltage for a second subset of the groups due to active area implantation for the second subset of groups that causes the second threshold voltage to be lower than the first threshold voltage, the first select gate for each group is connected to a first selection line, the second select gate for each group is connected to a second selection line; applying appropriate signals to the first selection line and the second selection to select one group from multiple groups connected to each of a plurality of bit lines; and performing a memory operation on the selected one group from multiple groups connected to each of the plurality of bit lines.

One embodiment of a non-volatile storage apparatus comprises a first bit line; a plurality of word lines; a first selection line; a second selection line; a first NAND string connected to the first bit line, the first NAND string includes a plurality of non-volatile storage elements, a first select gate and a second select gate, the first select gate is in communication with the first bit line and connected to the first selection line, the second select gate is connected to the first select gate and the second selection line, the second select gate is connected to one of the non-volatile storage elements of the first NAND string, the first select gate has a first threshold voltage, the second select gate has a programmable threshold voltage; and a second NAND string connected to the first bit line, the second NAND string includes a plurality of non-volatile storage elements, a third select gate and a fourth select gate, the word lines are connected to the first NAND string and the second NAND string, the third select gate is in communication with the first bit line and connected to the first selection line, the fourth select gate is connected to the third select gate and the second selection line, the fourth select gate is also connected to one of the non-volatile storage elements of the second NAND string, the second NAND string include active area implantation, the third select gate has a second threshold voltage that is lower than the first threshold voltage due to the active area implantation, the fourth select gate has a programmable threshold voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A non-volatile storage apparatus, comprising:
a plurality of groups of connected non-volatile storage elements, each group of the plurality of groups comprises multiple connected data non-volatile storage elements and multiple select gates on a common side of the data non-volatile storage elements, the multiple select gates on the common side comprise a first select gate and a second select gate, the first select gate having a first threshold voltage for a first subset of the groups and a second threshold voltage for a second subset of the groups due to active area implantation for the second subset of groups that causes the second threshold voltage to be lower than the first threshold voltage, the second select gate of each group having a programmable threshold voltage;
a plurality of bit lines, each of the plurality of bit lines is connected to multiple groups of the plurality of groups of connected non-volatile storage elements; and
a plurality of word lines, each of the word lines is connected to all of the groups of the plurality of groups of connected non-volatile storage elements.

2. The non-volatile storage apparatus of claim 1, further comprising:
a first selection line connected to the first select gate for each group; and
a second selection line connected to the second select gate for each group, whereby for each given one of the bit lines, applying appropriate respective signals to the first selection line and to the second selection provides for selection of one group from among the multiple groups connected to each given one of the plurality of bit lines.

3. The non-volatile storage apparatus of claim 2, wherein:
for each group, the first select gate is connected to the first selection line and is in communication with a respective bit line; and
for each group, the second select gate is connected to the second selection line, the first select gate and a data non-volatile storage element.

4. The non-volatile storage apparatus of claim 1, wherein:
each of the plurality of bit lines is connected to a respective first group and a respective second group among the plurality of groups, where the respective first and second groups are both in a common block;
the respective first group includes a respective one of the first select gates having the first and thus higher threshold voltage and a respective one of the second select gates having the lower second threshold voltage, the respective one of the first select gates being connected to a respective one of the bit lines and the respective one of second select gates being connected to the respective one of the first select gates and to a data non-volatile storage element for the first group;
the respective second group includes a respective second of the first select gates having the lower second threshold voltage and a respective second of the second select gates having the higher first threshold voltage, the respective second of the first select gates being connected to the respective one of the bit lines, to the respective second of the second select gates for the second group; and the respective second of the first select gates is connected to a data non-volatile storage element for the second group.

5. The non-volatile storage apparatus of claim 4, further comprising:
a first selection line connected to the first select gate for each group;
a second selection line connected to the second select gate for each group, whereby for each given one of the bit lines, applying a lower voltage on the first selection line and a higher voltage on the second selection line connects the second group to the respective bit line for a memory operation and applying a higher voltage on the first selection line and a lower voltage on the second selection line connects the first group to the respective bit line for a memory operation.

6. The non-volatile storage apparatus of claim 1, further comprising:
one or more managing circuits in communication with the non-volatile storage elements via the bit lines and word lines, the one or more managing circuits perform non-volatile programming of the second select gate for a subset of groups to aid independent selection of the groups from another group connected to a common bit line.

7. The non-volatile storage apparatus of claim 1, wherein:
the groups of connected non-volatile storage elements are NAND strings.

8. The non-volatile storage apparatus of claim 7, wherein:
each of the plurality of bit lines are connected to a first NAND string and a second NAND string that are both in a common block;
the first NAND string includes a first select gate with a higher threshold voltage and a second select gate with a lower threshold voltage, the first select gate is connected to a respective bit line, the second select gate is connected to the first select gate of the first NAND string and a data non-volatile storage element of the first NAND string; and
the second NAND string includes a first select gate with a lower threshold voltage and a second select gate with a higher threshold voltage, the first select gate is connected to the respective bit line, the second select gate of the second NAND string is connected to the first select gate of the second NAND string and a data non-volatile storage element of the second NAND string.

9. A process of operating a storage device that includes non-volatile storage elements provided as groups,
where with respect to multiple groups of the non-volatile storage elements where each group comprises multiple connected data non-volatile storage elements in series with two select gates on a common side of the group of data non-volatile storage elements where the two select gates include a first select gate and a second select gate, one of the first and second select gates being programmable and being doped differently than the other so as to have a lower threshold voltage due to the doping, the process comprising:
performing non-volatile programming of the programmable and doped differently select gates for at least a first of plural subsets of the groups, the respective first select gate of a first of the subsets having a first threshold voltage and having a respective second threshold voltage for a second subset of the groups due at least to being doped differently, where the first select gate for each group is connected to a first selection line, and the second select gate for each group is connected to a second selection line;

applying respective appropriate signals to the first selection line and the second selection to thereby select one group from multiple groups connected to each of a plurality of bit lines; and performing a memory operation on the selected one group from multiple groups connected to each of the plurality of bit lines.

10. The process of claim 9, wherein:

each of the bit lines are connected to a first group and a second group that are both in a common block;

the first group includes a first select gate with a higher threshold voltage and a second select gate with a lower threshold voltage, the first select gate is connected to a respective bit line, the second select gate is connected to the first select gate and a data non-volatile storage element for the first group; and the second group includes a first select gate with a lower threshold voltage and a second select gate with a higher threshold voltage, the first select gate is connected to the respective bit line, the second select gate for the second group is connected to the first select gate for the second group and a data non-volatile storage element for the second group;

applying a lower voltage on the first selection line and a higher voltage on the second selection line connects the second group to the respective bit line for a memory operation; and applying a higher voltage on the first selection line and a lower voltage on the second selection line connects the first group to the respective bit line for a memory operation.

11. A non-volatile storage apparatus, comprising:

a first bit line;
a plurality of word lines;
a first selection line;
a second selection line;

a first NAND string connected to the first bit line, the first NAND string includes a plurality of non-volatile storage elements, a first select gate and a second select gate, the first select gate is in communication with the first bit line and connected to the first selection line, the second select gate is connected to the first select gate and to the second selection line, the second select gate is connected to one of the non-volatile storage elements of the first NAND string, the first select gate has a first threshold voltage, the second select gate is programmable and is doped differently than the first select gate so as to have a lower second threshold voltage due to the doping of the second select gate whereby the second select gate of the first NAND string has a programmable and lower threshold voltage relative to the first select gate; and a second NAND string connected to the first bit line, the second NAND string includes a plurality of non-volatile storage elements, a third select gate and a fourth select gate, the word lines are connected to the first NAND string and the second NAND string, the third select gate is in communication with the first bit line and connected to the first selection line, the fourth select gate is connected to the third select gate and to the second selection line, the fourth select gate is also connected to one of the non-volatile storage elements of the second NAND string, the third select gate is programmable and is doped differently than the fourth select gate so as to have a lower second threshold voltage due to the doping of the third select gate whereby the third select gate of the second NAND string has a programmable and lower threshold voltage relative to the fourth select gate.

12. A data storage apparatus, comprising:

a plurality of groups of connected non-volatile storage elements, each group of the plurality of groups comprises multiple connected data non-volatile storage elements and multiple select gates on a common side of the data non-volatile storage elements, the multiple select gates on the common side comprise a first select gate and a second select gate, wherein the plurality of groups is subdivided into subsets and wherein the corresponding first select gates of respective groups in a first of the subsets have a first threshold voltage and the corresponding first select gates of respective groups in a second of the subsets are differently doped from the corresponding first select gates of the first of the subsets so as to have a second threshold voltage lower than the first threshold voltage due to the doping, wherein the select gates having the doping caused lower second threshold voltage are programmable gates such that the second threshold voltage is a programmable threshold voltage;

a plurality of bit lines, each of the plurality of bit lines is connected to multiple groups of the plurality of groups of connected non-volatile storage elements; and a plurality of word lines, each of the word lines is connected to all of the groups of the plurality of groups of connected non-volatile storage elements.

13. The data storage apparatus of claim 12 wherein:

wherein the select gates having the higher first threshold voltage are programmable gates such that the first threshold voltage is a programmable threshold voltage.

* * * * *